(12) United States Patent
Segev et al.

(10) Patent No.: US 10,707,355 B2
(45) Date of Patent: Jul. 7, 2020

(54) MULTIPLE STATE ELECTROSTATICALLY FORMED NANOWIRE TRANSISTORS

(71) Applicant: RAMOT AT TEL AVIV UNIVERSITY LTD., Tel Aviv (IL)

(72) Inventors: Gideon Segev, Kibutz Hahotrim (IL); Iddo Amit, Tel Aviv (IL); Alexander Henning, Losheim am See (DE); Yossi Rosenwaks, Hod Hasharon (IL)

(73) Assignee: RAMOT AT TEL AVIV UNIVERSITY LTD., Tel Aviv (IL)

( * ) Notice: Subject to any disclaimer, the term of this patent is extended or adjusted under 35 U.S.C. 154(b) by 242 days.

(21) Appl. No.: 15/309,832

(22) PCT Filed: May 18, 2015

(86) PCT No.: PCT/IB2015/053645
§ 371 (c)(1),
(2) Date: Nov. 9, 2016

(87) PCT Pub. No.: WO2015/181674
PCT Pub. Date: Dec. 3, 2015

(65) Prior Publication Data
US 2017/0243983 A1 Aug. 24, 2017

Related U.S. Application Data

(60) Provisional application No. 62/053,159, filed on Sep. 21, 2014, provisional application No. 62/002,994, (Continued)

(51) Int. Cl.
*H01L 29/775* (2006.01)
*H01L 29/66* (2006.01)
(Continued)

(52) U.S. Cl.
CPC .......... *H01L 29/8086* (2013.01); *B82Y 10/00* (2013.01); *H01L 29/0653* (2013.01);
(Continued)

(58) Field of Classification Search
CPC ............. H01L 29/8086; H01L 29/0676; H01L 29/417; H01L 29/0653; H01L 29/402;
(Continued)

(56) References Cited

U.S. PATENT DOCUMENTS 4,313,126 A * 1/1982 Krumm ............... H01L 29/0891
257/270
5,406,104 A 11/1995 Hirota et al.
(Continued)

FOREIGN PATENT DOCUMENTS

WO 2013128456 A1 10/2013

OTHER PUBLICATIONS

European Application # 15799125.8 search report dated Dec. 6, 2017.
(Continued)

*Primary Examiner* — M. A. Golub-Miller
(74) *Attorney, Agent, or Firm* — Kligler & Associates Patent Attorneys Ltd

(57) ABSTRACT

A transistor (100), including a planar semiconducting substrate (36), a source (42) formed on the substrate, a first drain (102) formed on the substrate, and a second drain (104) formed on the substrate in a location physically separated from the first drain. At least one gate (38, 40) is formed on the substrate and is configured to selectably apply an electrical potential to the substrate in either a first spatial pattern, which causes a first conductive path (62) to be established within the substrate from the source to the first drain, or a
(Continued)

second spatial pattern, which causes a second conductive path to be established within the substrate from the source to the second drain.

2 Claims, 13 Drawing Sheets

Related U.S. Application Data filed on May 26, 2014, provisional application No. 62/002,865, filed on May 25, 2014.

(51) Int. Cl.
| | |
|---|---|
| H01L 29/808 | (2006.01) |
| H01L 29/08 | (2006.01) |
| H01L 29/06 | (2006.01) |
| H01L 29/10 | (2006.01) |
| H01L 29/76 | (2006.01) |
| B82Y 10/00 | (2011.01) |
| H01L 29/417 | (2006.01) |
| H01L 29/40 | (2006.01) |
| H01L 29/423 | (2006.01) |
| H03K 17/00 | (2006.01) |
| H03K 19/00 | (2006.01) |
| H03K 17/693 | (2006.01) |

(52) U.S. Cl.
CPC ...... *H01L 29/0673* (2013.01); *H01L 29/0676* (2013.01); *H01L 29/0692* (2013.01); *H01L 29/0843* (2013.01); *H01L 29/1066* (2013.01); *H01L 29/402* (2013.01); *H01L 29/417* (2013.01); *H01L 29/42316* (2013.01); *H01L 29/66439* (2013.01); *H01L 29/76* (2013.01); *H01L 29/775* (2013.01); *H01L 29/8083* (2013.01); *H03K 17/002* (2013.01); *H03K 19/0002* (2013.01); *H01L 29/66977* (2013.01); *H03K 17/693* (2013.01)

(58) Field of Classification Search
CPC ............... H01L 29/42316; H01L 29/76; H01L 29/0673; H01L 29/0692; H01L 29/1066; H01L 29/0843; H01L 29/8083; H01L 29/775; H01L 29/66439; H01L 29/66977; B82Y 10/00; H03K 19/0002; H03K 17/002; H03K 17/693
See application file for complete search history.

(56) References Cited

U.S. PATENT DOCUMENTS

| | | | |
|---|---|---|---|
| 5,822,256 | A | 10/1998 | Bauer et al. |
| 5,894,435 | A | 4/1999 | Nobukata |
| 7,050,330 | B2 | 5/2006 | Forbes |
| 7,123,529 | B1 | 10/2006 | Hanson et al. |
| 7,215,563 | B2 | 5/2007 | Brandon et al. |
| 7,362,159 | B2 | 4/2008 | Fukuda |
| 7,485,908 | B2 | 2/2009 | Anwar et al. |
| 8,010,591 | B2 | 8/2011 | Mojarradi et al. |
| 8,059,469 | B2 | 11/2011 | Lee et al. |
| 8,274,824 | B1 | 9/2012 | Bu |
| 8,278,712 | B2 | 10/2012 | Kao et al. |
| 8,318,505 | B2 | 11/2012 | Shalev et al. |
| 8,658,523 | B2 | 2/2014 | Faulkner et al. |
| 8,674,470 | B1 | 3/2014 | Or-Bach et al. |
| 2006/0141678 | A1 | 6/2006 | Montgomery et al. |
| 2006/0237777 | A1 | 10/2006 | Choi et al. |
| 2009/0121288 | A1 | 5/2009 | Patruno |
| 2013/0114355 | A1 | 5/2013 | Takeuchi et al. |
| 2015/0017740 | A1 | 1/2015 | Shalev et al. |

OTHER PUBLICATIONS

International Application # PCT/IB2015/053645 Search Report dated Sep. 2, 2015.
Czaplewski et al., "A nanomechanical switch for integration with CMOS logic", IOP Publishing, Journal of Micromechanics and Microengineering, vol. 19, 12 pages, Jul. 9, 2009.
Balla et al., "Low power dissipation MOS ternary logic family", IEEE Journal of Solid-State Circuits, vol. 19, No. 5, pp. 739-749, Oct. 1984.
Capasso et al., "Quantum functional devices: resonant-tunneling transistors, circuits with reduced complexity, and multiple valued logic", IEEE Transactions on Electron devices, vol. 36, No. 10, pp. 2065-2082, Oct. 1989.
Cristoloveanu et al., "The four-gate transistor", 32th European Solid-State Device Research Conference, pp. 323-326, Florence, Italy, Sep. 24-26, 2002.
Inokawa et al.,"A multiple-valued logic and memory with combined single-electron and metal-oxide-semiconductor transistors", IEEE Transactions on Electron devices, vol. 50, No. 2, pp. 462-470, Feb. 2003.
Huang et al., "Logic gates and computation from assembled nanowire building blocks", Science, vol. 294, No. 5545, pp. 1313-1317, Nov. 9, 2001.
Shalev et al., "Specific and label-free femtomolar biomarker detection with an electrostatically formed nanowire biosensor," NPG Asia Materials, vol. 5, e41, 7 pages, Mar. 2013.
Glazman et al., "Lateral position control of an electron channel in a split-gate device", Semiconductor Science and Technology Journal, vol. 6, No. 1, pp. 32-35, year 1991.
Heung et al., "Depletion/enhancement CMOS for a lower power family of three-valued logic circuits", IEEE Journal of Solid-State Circuits, vol. sc-20, No. 2, pp. 609-616, Apr. 1985.
Capasso et al. "Multiple-state resonant-tunneling bipolar transistor operating at room temperature and its application as a frequency multiplier", IEEE Electron Device Letters, vol. 9, No. 10, pp. 533-535, Oct. 1988.
Waho, T., "Resonant tunneling transistor and its application to multiple-valued logic circuits", Proceedings of 25th International Symposium on Multiple-Valued Logic, pp. 130-138, May 23-25, 1995.
Liu et al., Multiple-route and multiple-state current-voltage characteristics of an InP/AlInGaAs switch for multiple-valued logic applications, IEEE Transactions on Electron Devices, vol. 47, No. 8, pp. 1553-1559, Aug. 2000.
Wakayama et al., "Self-Assembled Molecular Nanowires of 6, 13-Bis (methylthio) pentacene: Growth, Electrical Properties, and Applications", Nano Letters, vol. 8, No. 10, pp. 3273-3277, year 2008.
Blalock et al ., "The multiple-gate MOS-JFET transistor", International Journal of High Speed Electronics and Systems, vol. 12, No. 2, pp. 511-520, year 2002.
Dufrene et al., "Investigation of the four-gate action in G4-FETs," IEEE Transactions on Electron Devices, vol. 51, No. 11, pp. 1931-1935, Nov. 2004.
Balestra et al., "Double-gate silicon-on-insulator transistor with volume inversion: A new device with greatly enhanced performance", IEEE Electron Device Letters, vol. EDL-8, No. 9, pp. 410-412, Sep. 1987.

\* cited by examiner

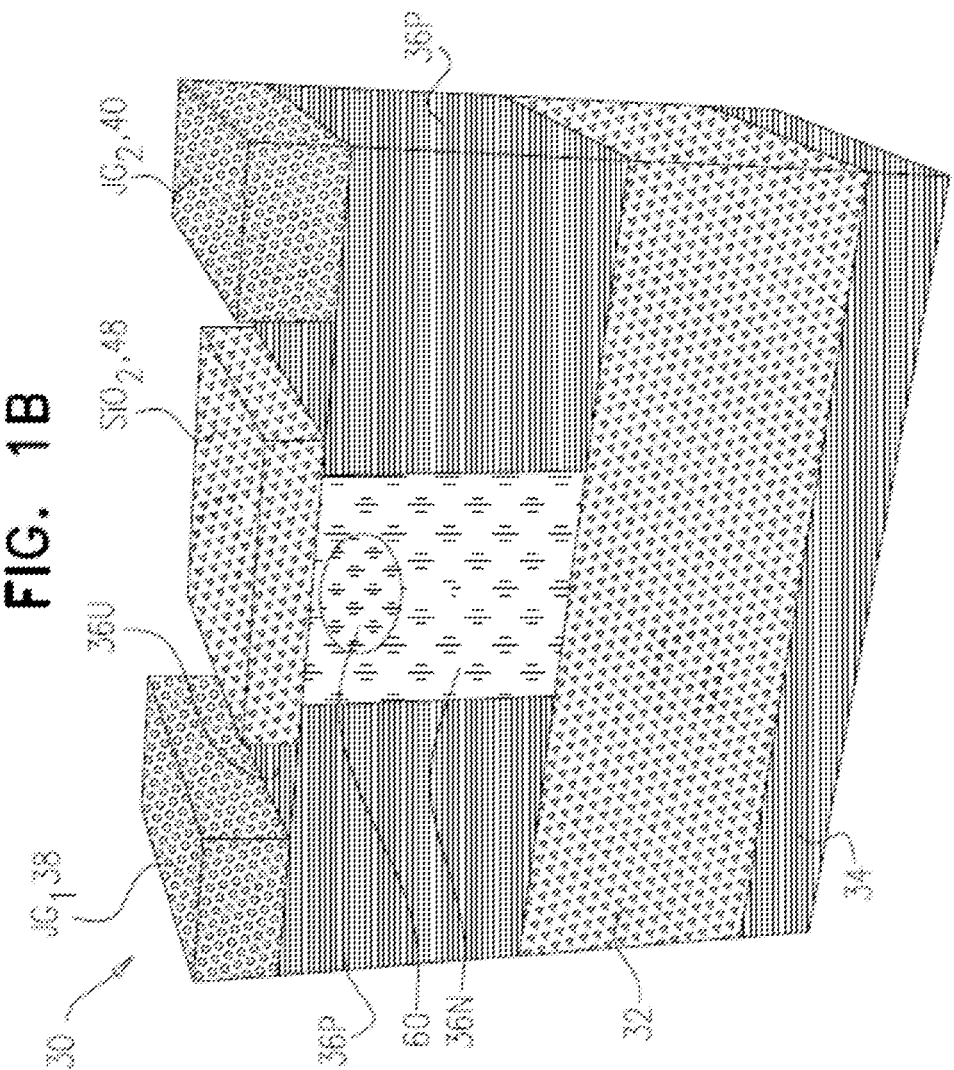

MULTIPLE STATE ELECTROSTATICALLY FORMED NANOWIRE TRANSISTORS

CROSS-REFERENCE TO RELATED APPLICATIONS

This application claims the benefit of U.S. Provisional Patent Applications 62/053,159 filed Sep. 21, 2014, 62/002,994 filed May 26, 2014, and 62/002,865 filed May 25, 2014, which are incorporated herein by reference.

FIELD OF THE INVENTION

The present invention relates generally to transistors, and specifically to transistors which are able to exist in multiple states.

BACKGROUND OF THE INVENTION

From its beginning the semiconductor industry has relied on transistor miniaturization in order to increase computation performance. However, as transistor sizes are soon to reach their fundamental limit, a replacement for the current CMOS (complementary metal oxide semiconductor) technology has been widely sought. Multiple Valued Logic (MVL) has several advantages over binary logic for very-large-scale-integration (VLSI) design, as complex arithmetic operations can be performed with a reduced number of MOS transistors. Research on ternary logic (three-value logic) based on standard MOSFETs (metal oxide semiconducting field effect transistors) has been conducted in the 1980s.

However, this technology was never widely implemented. Resonant-Tunneling Bipolar Transistor (RTBT) and similar resonant-tunneling devices, particularly devices with multiple negative differential resistance (MNDR), have also been proposed as building blocks for MVL circuits. RTBT devices are three terminal heterojunction bipolar transistors and hence are fundamentally different from, and are not compatible with, current CMOS technology. Furthermore, such devices consist of non-conventional elements limiting wide spread implementation of the devices. Several other multiple valued logic devices have been proposed but, as for the RTBT device, they cannot be implemented into current VLSI technology.

SUMMARY

An embodiment of the present invention provides a transistor, including:
a planar semiconducting substrate;
a source formed on the substrate;
a first drain formed on the substrate;
a second drain formed on the substrate in a location physically separated from the first drain; and
at least one gate formed on the substrate and configured to selectably apply an electrical potential to the substrate in either a first spatial pattern, which causes a first conductive path to be established within the substrate from the source to the first drain, or a second spatial pattern, which causes a second conductive path to be established within the substrate from the source to the second drain.

Typically the at least one gate includes two spatially separated gates and the first and the second conductive paths are established between the two gates.

In a disclosed embodiment the transistor includes at least one further drain physically separated from the first and second drains and formed on the substrate, and the at least one gate is configured to selectably apply the electrical potential to the substrate in at least one further spatial pattern so as to cause at least one further conductive path to be established from the source to the at least one further drain.

In a further disclosed embodiment an insulating separator is formed on the substrate between the first and the second drains.

In a yet further disclosed embodiment a non-insulating separator is formed on the substrate between the first and the second drains. Typically the electric potential is applied to the non-insulating separator. The non-insulating separator may be galvanically connected to the at least one gate.

In an alternative embodiment the source, the first drain, the second drain, and the at least one gate are formed on a single planar surface of the substrate.

Alternatively, the planar semiconducting substrate has a first face and a second face opposite the first face, and the source is formed on the first face; and the first drain and the second drain are formed on the second face. The first drain and the second drain may be included in a rectangular m×n array of physically separated drains formed on the second face, where at least one of m and n is a positive integer greater than 1. The at least one gate may consist of four spatially separated gates disposed about the rectangular array and formed on one of the first and second faces of the substrate. The transistor may include at least one state to gates component configured to receive a ternary input state and in response to supply respective voltage outputs to opposing two of the four gates. The at least one state to gates component may include two state to gates components configured to supply respective voltage outputs to respective opposing gates, and the rectangular m×n array may be a 3×3 array, and the transistor may be configured as a two ternary input state, nine output state multiplexer.

In a further alternative embodiment the transistor includes a third drain formed on the substrate, physically separated from the first and the second drain, and the at least one gate is configured to selectably apply the electrical potential to the substrate in a third spatial pattern so as to cause a third conductive path to be established within the substrate from the source to the third drain, so that the transistor performs a ternary logical operation.

There is further provided, according to an embodiment of the present invention, a method, including:
utilizing a planar semiconducting substrate;
forming a source on the substrate;
forming a first drain on the substrate;
forming a second drain on the substrate in a location physically separated from the first drain; and
forming at least one gate on the substrate, and configuring the at least one gate to selectably apply an electrical potential to the substrate in either a first spatial pattern, which causes a first conductive path to be established within the substrate from the source to the first drain, or a second spatial pattern, which causes a second conductive path to be established within the substrate from the source to the second drain.

There is further provided, according to an embodiment of the present invention a transistor, including:
a planar semiconducting substrate;
a drain formed on the substrate;
a first source formed on the substrate;
a second source formed on the substrate in a location physically separated from the first source; and
at least one gate formed on the substrate and configured to selectably apply an electrical potential to the substrate in either a first spatial pattern, which causes a first conductive path to be established within the substrate from the first source to the drain, or a second spatial pattern, which causes a second conductive path to be established within the substrate from the second source to the drain.

The transistor may include an insulating separator formed on the substrate between the first and the second sources.

Alternatively or additionally, the transistor may include a non-insulating separator formed on the substrate between the first and the second sources. Typically the electrical potential is applied to the non-insulating separator. The non-insulating separator may be galvanically connected to the at least one gate.

In a disclosed embodiment the drain, the first source, the second source, and the at least one gate are formed on a single planar surface of the substrate.

Alternatively, the planar semiconducting substrate has a first face and a second face opposite the first face, and the drain is formed on the first face; and the first source and the second source are formed on the second face.

There is further provided, according to an embodiment of the present invention, a transistor, including:

a semiconducting substrate;

a plurality of physically separated drains formed on the substrate;

a multiplicity of physically separated sources, each of the sources being physically separated from the drains, formed on the substrate; and at least one gate, formed on the substrate, configured to selectably apply an electrical potential to the substrate in a spatial pattern so as to establish a single conductive path within the substrate from a single selected drain to a single selected source.

There is further provided, according to an embodiment of the present invention a method, including:

utilizing a planar semiconducting substrate;

forming a drain on the substrate;

forming a first source on the substrate;

forming a second source on the substrate in a location physically separated from the first source; and forming at least one gate on the substrate and configuring the at least one gate to selectably apply an electrical potential to the substrate in either a first spatial pattern, which causes a first conductive path to be established within the substrate from the first source to the drain, or a second spatial pattern, which causes a second conductive path to be established within the substrate from the second source to the drain.

There is further provided, according to an embodiment of the present invention a method, including:

utilizing a semiconducting substrate;

forming a plurality of physically separated drains on the substrate;

forming a multiplicity of physically separated sources on the substrate, each of the sources being physically separated from the drains; and forming at least one gate on the substrate, and configuring the at least one gate to selectably apply an electrical potential to the substrate in a spatial pattern so as to establish a single conductive path within the substrate from a single selected drain to a single selected source.

The Detailed Description below is to be read in conjunction with the drawings, a brief description of which follows.

BRIEF DESCRIPTION OF THE DRAWINGS

FIGS. 1(a) and 1(b) are schematic perspective and cross-sectional illustrations of an Electrostatically Formed Nanowire (EFN) based transistor, according to an embodiment of the present invention;

DETAILED DESCRIPTION OF EMBODIMENTS

Overview

Embodiments of the present invention provide a novel Multiple State Electrostatically Formed Nanowire Transistor (MSET) that, inter alia, implements complete multiplexer functionality in a single transistor like device. The multiplexer functionality allows a very simple implementation of any logic function and the multiple state operations increase the possible uses far beyond binary logic.

In one embodiment, a two-dimensional (2D) MSET is formed on one surface of a planar semiconducting substrate.

A source is formed on the surface, and two drains, physically separated from each other and from the source, are also formed on the surface. At least one gate, typically two gates, is also formed on the surface. The at least one gate is configured to selectably apply an electrical potential to the substrate in either a first spatial pattern, which causes a first conductive path to be established within the substrate from the source to the first drain, or in a second spatial pattern, which causes a second conductive path to be established within the substrate from the source to the second drain. In the case of more than one gate, it will be understood that applying the electrical potential may comprise applying different potentials to at least some of the gates.

In an alternative embodiment, a three-dimensional (3D) MSET is formed on a first and a second face of a planar semiconducting substrate. A source is formed on the first face, and first and second drains, physically separated from each other, are formed on the second face. At least one gate, typically two gates, is formed on at least one of the faces. As for the 2D MSET, the at least one gate is configured to selectably apply an electrical potential to the substrate in one of two spatial patterns so as to cause a first conductive path to be established within the substrate from the source to the first drain, or to cause causes a second conductive path to be established within the substrate from the source to the second drain.

In other embodiments, rather than an MSET being formed with one source and multiple drains, it is formed of multiple sources and a single drain. In yet other embodiments an MSET may be formed with multiple sources and multiple drains. In all cases application of a predetermined electrical potential to at least one gate of the MSET generates a single conductive path within the substrate of the MSET, between the sources and the drains.

DETAILED DESCRIPTION

1. Physical Embodiments

Figure 1A:
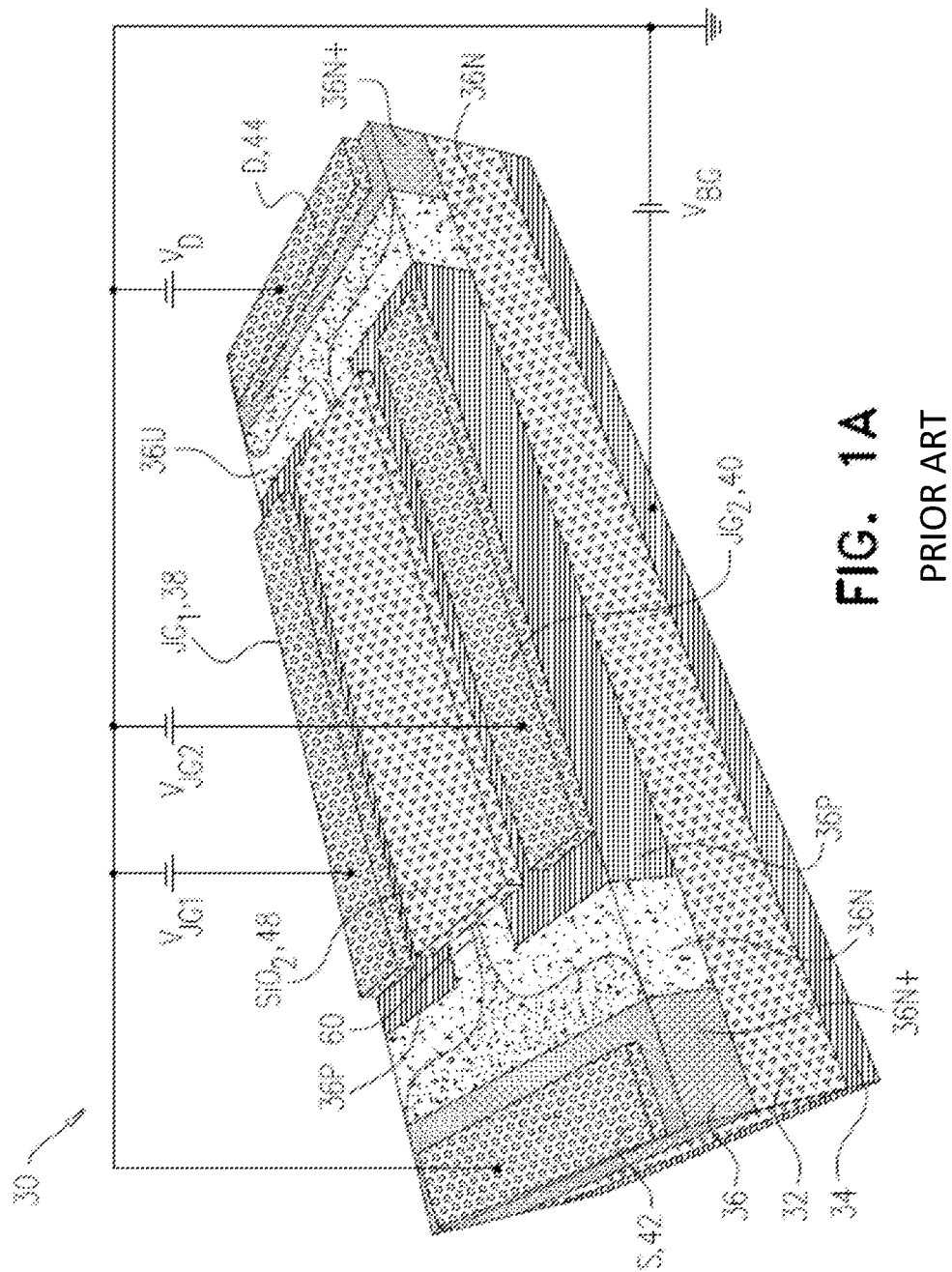

FIG. 1(a) shows a schematic design of an Electrostatically Formed Nanowire (EFN) based transistor 30 and FIG. 1(b) schematically illustrates the formation of the EFN in a cross section view, according to an embodiment of the present invention. The EFN based transistor illustrated in the figures comprises an insulating sheet 32, herein assumed by way of example to comprise $SiO_2$, sandwiched between lower and upper semiconducting sheets 34, 36. Conductive junction gates $JG_1$, $JG_2$, as well as a conductive source S and a conductive drain D, are formed on an upper surface 36U of upper semiconducting sheet 36, which acts as a substrate for transistor 30. In fabrication of transistor 30, upper conducting sheet 36 is doped to form n, n+ and p+ regions 36N, 36N$^+$, 36P as are illustrated in the figures. Region 36P surrounds gates $JG_1$, $JG_2$, region 36N$^+$ surrounds the source and the drain, and region 36N is between the two regions 36P.

Gates $JG_1$, $JG_2$, source S and drain D are also respectively referred to herein as gates 38, 40, source 42, and drain 44. An insulating sheet 48, typically of $SiO_2$ may also be formed on the upper surface of semiconducting sheet 36. Potentials $V_{JG1}$, $V_{JG2}$, $V_D$, and $V_{BG}$, as are indicated in FIG. 1(a), are applied between the conductive elements and a ground, and between lower semiconducting sheet 34 and the ground. The applied potentials generate regions with varying conductivity within n region 36N in the upper semiconducting sheet. If a specific bias is applied to the junction gates, the conduction band electrons between the gates are confined to a well-defined area forming a narrow conductive channel 60, the Electrostatically Formed Nanowire. The location and magnitude of the nanowire is determined by the bias applied to the drain, and to the two junction gates, and, depending on the bias applied to the junction gates, the nanowire can be moved laterally.

Conductive channel 60, the Electrostatically Formed Nanowire of transistor 30, supports transport of charge carriers, the charge carriers being negative or positive depending on the doping of region 36N. In the following description, except where otherwise stated, the nanowire is assumed to support negative charge carriers. Those having ordinary skill in the art will be able to adapt the description, mutatis mutandis, for the case where the nanowire supports positive charge carriers.

In a disclosed embodiment region 36P and insulating sheet 32 have thicknesses of 0.15 µm and 1.5 µm respectively, and region 36N has a width of 0.5 µm. However, these dimensions are purely by way of example, and in no way are to be assumed to limit the scope of embodiments of the present invention.

Figure 2:
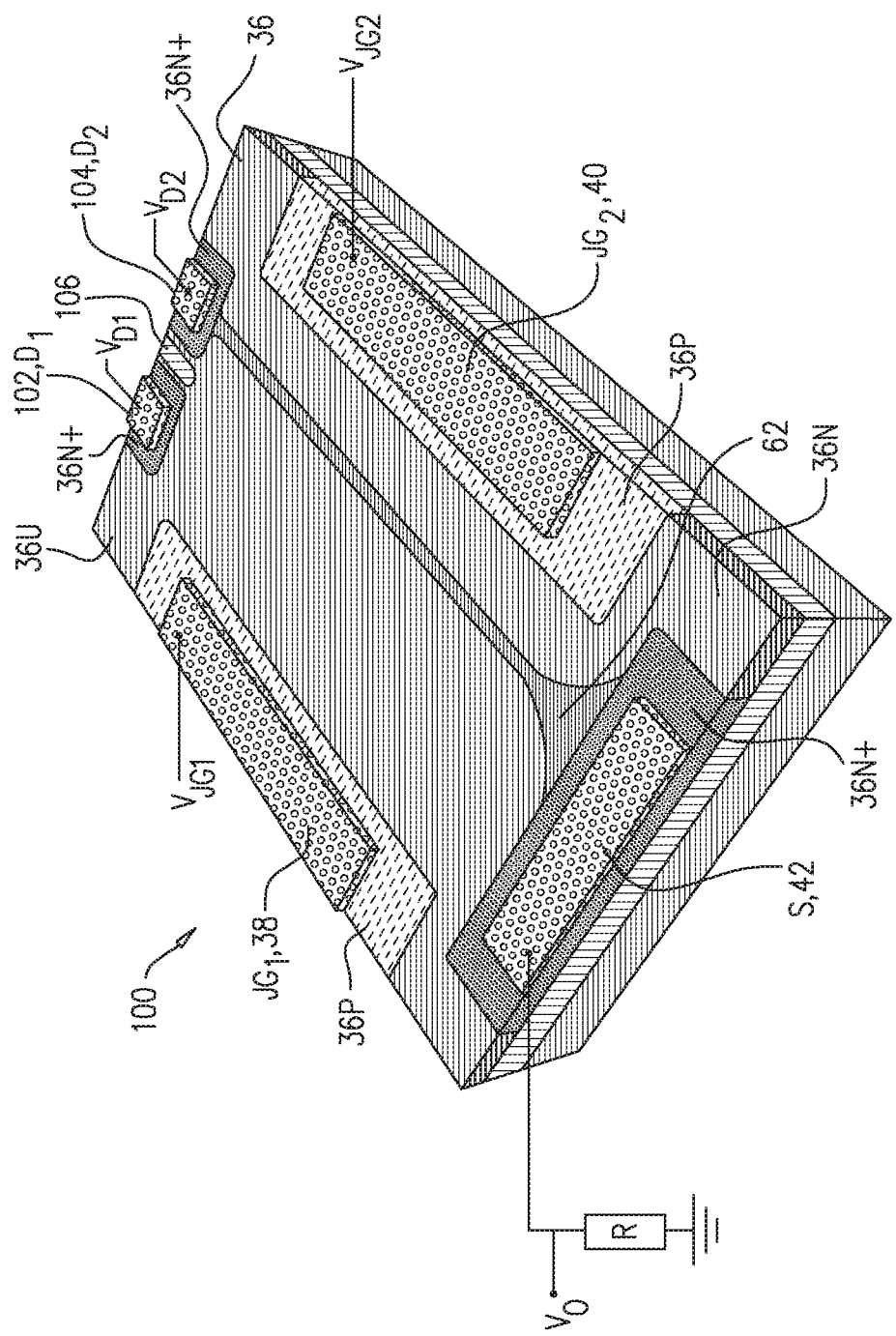
FIG. 2 is a schematic perspective illustration of a two-dimensional (2D) multiple state EFN based transistor (MSET), according to an embodiment of the present invention.

FIG. 2 is a schematic perspective illustration of a two-dimensional (2D) multiple state EFN based transistor (MSET) 100, according to an embodiment of the present invention. Except as described below, the structure of the MSET is generally as described above for the EFN transistor of FIGS. 1(a) and 1(b) and elements indicated by the same reference numerals in both transistors 30 and 100 are generally similar in construction and in operation. Typically, the elements are formed by processes such as doping and/or deposition in a fabrication facility. For simplicity, in the description herein of MSETs, only one such MSET is considered. However, it will be understood that in most cases there may be many MSETs formed as part of a single integrated circuit, and those having ordinary skill in the art will be able to adapt the description to account for multiple MSETs being formed on such a circuit.

In contrast to the EFN transistor, MSET 100 has multiple, isolated, i.e., physically separated, drains. For simplicity, and by way of example, the number of isolated drains illustrated in FIG. 2 is two, so that MSET 100 has two isolated drains 102 and 104, also referred to respectively as drains $D_1$ and $D_2$, separated by an insulating separator 106, typically of $SiO_2$. However, it will be understood that embodiments of the present invention may be implemented with any convenient number of physically separated drains. Thus, in general an MSET has n isolated drain inputs, $D_1, \ldots, D_n$, separated by (n−1) separators, where n is a positive integer greater than 1, and where each drain is connected to a specific voltage, $V_{D1}, \ldots, V_{Dn}$ according to the required functionality. In addition 2D MSET 100 has source S, 42, assumed to be operating at a voltage $V_O$, and two junction gates $JG_1$, 38, $JG_2$, 40, connected respectively to voltages $V_{JG1}$ and $V_{JG2}$. Gates $JG_1$, $JG_2$, are surrounded by region 36P, the source and the drains are surrounded by regions 36N$^+$, and region 36N is between regions 36P. The source, the junction gates, and the multiple drains are in a generally 2D configuration, being formed on upper surface 36U of upper semiconducting sheet 36. FIG. 2 shows an illustration of a two-drain MSET device embedded in a circuit, comprising a resistor R connected between the source and, by way of example, ground (0), the circuit allowing definitions of voltage based states. In embodiments of the present invention resistor R may be connected to any convenient voltage level, not necessarily 0.

In the circuit illustrated in FIG. 2 a predetermined combination of junction gate voltages directs the EFN to couple to one of the drains, establishing a single conduction path 62 within the substrate between a single drain and the source. A combination of junction gate voltages defines a spatial pattern of potentials applied to a substrate. Depending on the actual values of the voltages on the junction gates, different electrical potential spatial patterns, i.e., different voltages on the gates, are applied to the substrate to establish the conduction path. Typically, the predetermined combination of junction gate voltages are generated by specific elements coupled to the junction gates, such as the state to gates circuit or voltage shifting circuit described below, Alternatively or additionally, the junction gate voltages may be generated by other convenient voltage generators, including, for example, a central processing unit, or the output of a logical or analog circuit.

The circuit output is assumed to be a voltage $V_O$ developed at the source. When a negative voltage $V_1$ is applied to one of the gates and 0 is applied to the other, the conduction channel will couple to the drain closest to the latter gate. In FIG. 2, the applied biases are $V_{JG1}=V_1$ and $V_{JG2}=0$, so that the EFN couples to $D_2$. Since the resistance of the conduction path between $D_2$ and the source is significantly lower than the resistance of the serial resistor R, the output voltage is $V_O=V_{D2}$. When both gates are at a negative voltage $V_2$, where $V_2<V_1<0$, the entire region between the two gates is completely depleted. As a result, the resistance between the source and the two drains is higher than R and $V_O$ is, in the example illustrated here, 0. Values of $V_1$ and $V_2$ may typically be from −0.3V or less negative values to −1.5V or more negative values. Actual values of $V_1$ and $V_2$ are technology dependent and may be determined by one of ordinary skill in the art without undue experimentation.

When both gates are at 0 there is conduction from the source to both drains and the state is undefined. When one gate is at $V_1$ and the other is at $V_2$ the output voltage can be between 0 and the corresponding drain voltage, depending on the specific device engineering. It should be noted that as in CMOS configurations, the configuration of FIG. 2 possesses very low current flow through the device once the state is determined. In order to further reduce the source current, the resistor in FIG. 2 can be replaced with transistors that will conduct or isolate the path between $V_O$ and the ground according to the desired functionality. In some embodiments both gates may be at 0 or at voltages other than $V_1$ and $V_2$, in which case the output voltage is between 0 and the highest drain voltage. It will be understood that the intermediate states of these embodiments can increase the device functionality considerably but may result in somewhat higher currents through the drains.

Table 1 below shows the truth table for the MSET based circuit illustrated in FIG. 2.

TABLE 1

2 drains MSET truth table.

| $V_{JG1}$ | $V_{JG2}$ | $V_O'$ |
|---|---|---|
| 0 | 0 | — |
| 0 | $V_1$ | $V_{D1}$ |
| $V_1$ | 0 | $V_{D2}$ |
| $V_2$ | $V_2$ | 0 |

The addition of one or more drains to the MSET of FIG. 2 will greatly increase the functionality of the MSET. For example, adding a third drain $D_3$ to the MSET of FIG. 2, so that $D_2$ becomes a "middle" drain, enables the device to perform quaternary based logical operations, since there are now three possible conduction paths to the drains and one case where there is no conduction from any drain. In this case, conduction through drain $D_1$ is possible when $V_{JG1}=0$ and $V_{JG2}=V_2$. Conduction through the middle drain $D_2$ is possible when both gates are at $V_1$ and conduction through drain $D_3$ is possible when $V_{JG2}=0$ and $V_{JG1}=V_2$. When both gates are at $V_2$ there is no conduction through any of the drains and the output is 0. $V_1$ and $V_2$ in this three drain example do not necessarily have the same values as $V_1$ and $V_2$ in the two drain example described above. Table 2 below shows the truth table for this three drain example.

TABLE 2

3 drains MSET truth table.

| $V_{JG1}$ | $V_{JG2}$ | $V_O'$ |
|---|---|---|
| 0 | $V_2$ | $V_{D1}$ |
| $V_1$ | $V_1$ | $V_{D2}$ |
| $V_2$ | 0 | $V_{D3}$ |
| $V_2$ | $V_2$ | 0 |

The two and three drain MSETs described above are examples of embodiments of the present invention having a 2D architecture, where the source, the gates, and the drains are located on a common plane, in the examples described the upper surface of upper semiconducting sheet 36. In general there may be n isolated drains (n>1) in MSETs having a 2D architecture. However, embodiments of the present in invention are not limited to 2D MSETs, and, as described in more detail below, include MSETs having a three dimensional (3D) architecture.

Figure 3A:
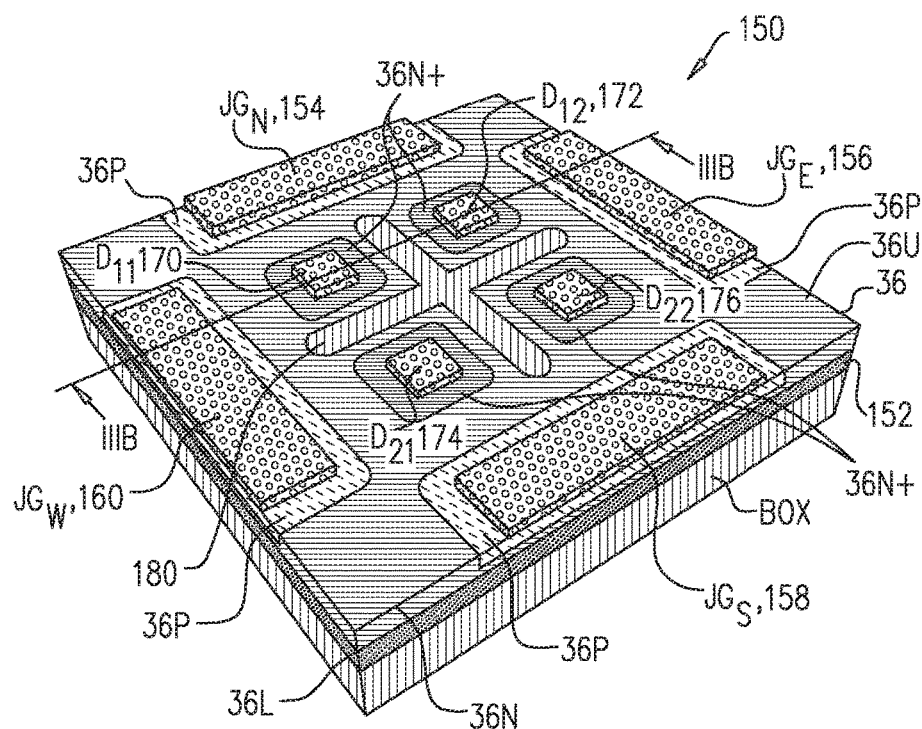
FIG. 3(a) is a schematic perspective illustration of a three-dimensional (3D) MSET having multiple isolated drains.
Figure 3B:
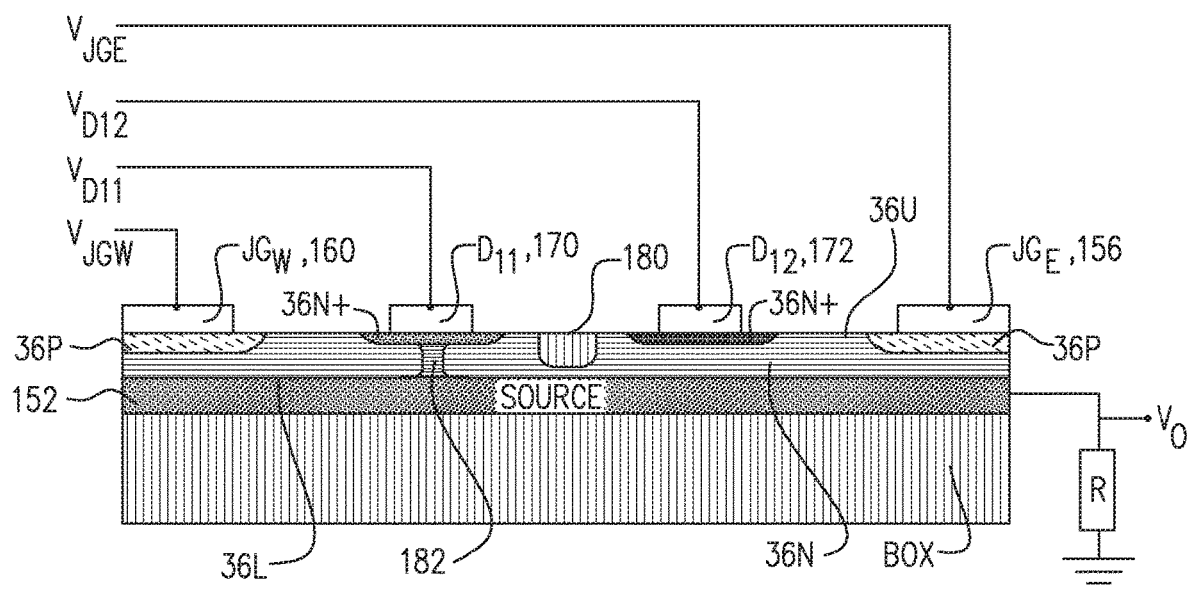
FIG. 3(b) is a schematic cross-section of the 3D MSET, according to an embodiment of the present invention.

FIG. 3(a) is a schematic perspective illustration of a 3D MSET 150 having multiple isolated drains, and FIG. 3(b) is a schematic cross-section of the 3D MSET, according to an embodiment of the present invention. The cross-section is taken along a line IIIB-IIIB. Apart from the differences described below, the operation of MSET 150 is generally similar to that of MSET 100 (FIG. 2), and elements indicated by the same reference numerals in both MSET 100 and 150 are generally similar in construction and in operation. As for the 2D MSET described above, different voltages on the junction gates of 3D MSET 150 define different electrical potential spatial patterns applied to the substrate of the 3D MSET, establishing different respective conduction paths. However, in contrast to the architecture described above for the 2D MSETs, in 3D MSET 150 source 152 is not on a common surface with the multiple isolated drains. In the embodiment illustrated in FIGS. 3(a) and 3(b), source 152 is connected to a lower surface 36L of upper semiconducting sheet 36, and the multiple drains are on upper surface 36U of the sheet. The source is assumed to be mounted on an insulating buried oxide layer (BOX). (It will be understood that this type of MSET construction is by way of example, and the scope of the present invention comprises other methods of construction, such as, but not limited to, forming an MSET using an organic semiconductor deposited on a plastic sheet.) Other differences from the 2D MSETs are described below.

In the 3D MSET, by way of example four conductive junction gates $JG_N$, 154, $JG_E$, 156, $JG_S$, 158, and $JG_W$, 160 are located on upper surface 36U of rectangular semiconducting sheet 36, at the edges of sheet. In other embodiments there are fewer or greater than four junction gates. Each gate is surrounded by a region 36P, and there is a region 36N between regions 36P. Between the gates is positioned a rectangular m (rows)×n (columns) array of isolated conductive drains $D_{mn}$, which are implemented as islands on the upper surface of the semiconducting sheet. In general m and n may be any positive integers, at least one of m, n being greater than 1, and the drains may be further separated by insulating barriers let into the upper surface of the semiconducting sheet. In the example illustrated m=n=2, so that there are four drains $D_{11}$, 170, $D_{12}$, 172 $D_{21}$, 174 and $D_{22}$, 176, each surrounded by an n+ region, and the drains are separated from each other by an insulating barrier 180, typically of $SiO_2$, in the form of a cross.

Conductive source 152 is located on lower surface 36L of the semiconducting sheet. As for the 2D MSET, with appropriate choices of voltages (on the drains, gates, and source), a conductive nanowire 182 forms between the source and one of the drains. However, in contrast to the 2D MSET, in the 3D MSET the conductive nanowire can be translated in two dimensions. In the example illustrated, the device shown has 4 input channels $V_{JGN}$, $V_{JGE}$, $V_{JGS}$, and $V_{JGW}$ respectively to gates 154, 156, 158, and 160. (Only the inputs to gates 156 and 160 are shown in the figures.) The voltages of opposing "east-west" gates ($V_{JGE}$ and $V_{JGW}$ respectively) determine the chosen drain column and the voltages of the other opposing gates, the "north-south" gates, ($V_{JGN}$ and $V_{JGS}$ respectively) determine the chosen row. In this example $V_{JGS} < V_{JGN} < 0$ and $V_{JGE} < V_{JGW} < 0$ and the EFN forms a conduction path between $D_{11}$ and the source. If the device output is determined by the source voltage and $V_1$ and $V_2$ are defined as for the 2 drain MSET described above, 4 outputs $V_{D11}$, $V_{D12}$, $V_{D21}$, and $V_{D22}$ are possible. Table 3 below shows a truth table for a 3D MSET with 4 drains. Choosing voltages other than those in Table 3 (i.e., voltages other than $V_1$ and $V_2$) can add to the number of possible states but may cause high currents to pass between the drains leading to high power consumption.

TABLE 3

4 gates 4 drain MSET truth table.

| $V_{JGN}$ | $V_{JGS}$ | $V_{JGW}$ | $V_{JGE}$ | $V_O$ |
|---|---|---|---|---|
| 0 | 0 | 0 | 0 | — |
| 0 | $V_1$ | 0 | $V_1$ | $V_{D11}$ |
| 0 | $V_1$ | $V_1$ | 0 | $V_{D12}$ |
| $V_1$ | 0 | 0 | $V_1$ | $V_{D21}$ |
| $V_1$ | 0 | $V_1$ | 0 | $V_{D22}$ |
| $V_2$ | $V_2$ | $V_2$ | $V_2$ | 0 |

As in the 2 gates configuration, adding more drains will increase the device functionality significantly and allow realization of non-binary logic. For example, assuming voltages $V_1$ and $V_2$ as in the 3 drain MSET example above, the truth table for a 4 gates, 9 drain MSET is given in Table 4 below.

TABLE 4

4 gates, 9 drain MSET truth table.

| $V_{JGE}$ | $V_{JGW}$ | $V_{JGN}$ | $V_{JGS}$ | $V_O$ |
|---|---|---|---|---|
| 0 | $V_2$ | 0 | $V_2$ | $V_{D11}$ |
| $V_1$ | $V_1$ | 0 | $V_2$ | $V_{D12}$ |
| $V_2$ | 0 | 0 | $V_2$ | $V_{D13}$ |
| 0 | $V_2$ | $V_1$ | $V_1$ | $V_{D21}$ |
| $V_1$ | $V_1$ | $V_1$ | $V_1$ | $V_{D22}$ |
| $V_2$ | 0 | $V_1$ | $V_1$ | $V_{D23}$ |
| 0 | $V_2$ | $V_2$ | 0 | $V_{D31}$ |
| $V_1$ | $V_1$ | $V_2$ | 0 | $V_{D32}$ |
| $V_2$ | 0 | $V_2$ | 0 | $V_{D33}$ |

2. Functionality

Different basic logical functions, both binary and non-binary, can be implemented with a single MSET. While, for simplicity, a three drains 2D MSET is considered in this section, the functional possibilities of MSET devices are limited only by the ability to fabricate densely packed, isolated drains and the EFN movement range. The circuit assumed in this section is similar to that of FIG. 2 with the exception that the 2 drain MSET is replaced with a 3 drain MST where each drain $D_1$, $D_2$, $D_3$ is connected to a specific drain voltage $V_{D1}$, $V_{D2}$, and $V_{D3}$. We define voltage levels $V_2 < V_1 < 0$ as discussed in the 3 drains example above. In this case there are 4 different EFN states:

States $S_1$, $S_3$. When one gate is at voltage 0 and the other is at $V_2$ the EFN connects the drain next to the 0 biased gate with the source. State $S_1$ marks the case where the EFN is next to $D_1$, and $V_O = V_{D1}$. State $S_3$ is the opposite state when the EFN is next to $D_3$ and $V_O = V_{D3}$.

State $S_2$. When both gates are at $V_1$ the EFN will connect to $D_2$ and $V_O = V_{D2}$ This is state $S_2$.

When both gates are at voltage $V_2$ the region between the gates is completely depleted and there is no conduction between source and drains. This state is a high impedance state (HZ).

Since 3 possible inputs allow choosing between 3 different values for $V_O$ the MSET has an inherent multiplexer and/or logic gate functionality. Hence, with a proper choice of $V_{D1}$, $V_{D2}$, $V_{D3}$, any functionality can be achieved. Connecting two MOSFETs in series between the MSET source and ground, where the gate of each MOSFET is connected to one of the MSETs gates, allows identifying a state of no conduction, the HZ state, with a fourth level where $V_O = 0$.

For example, in an implementation of binary logic gates we may assume that the inputs are the voltages on the side gates $JG_1$ and $JG_2$ i.e., $V_{JG1}$ and $V_{JG2}$. The output $V_O$ is assumed to be 0 if $V_O = 0$ and is assumed to be 1 if $V_O \neq 0$.

As stated above, embodiments of the present invention may be used as non-binary logic components. An example of a ternary state MSET and its use is described below.

Ternary State Multiplexer

A ternary state component has three states: 0, 1, and 2. For the 2 gate, 3 drain MSET assumed in this section, state 0 may be assumed to correspond to drain $D_1$ being connected to the source, state 1 may be assumed to correspond to drain $D_2$ being connected to the source, and state 2 may be assumed to correspond to drain $D_3$ being connected to the source. A circuit that translates a given state value, 0, 1, or 2, having corresponding input voltage levels 0, $V_{s1}$, $V_{s2}$, to required gate voltages may be coupled to the MSET, and we refer to this circuit as a State to Gates circuit (S2G). An S2G has one input—the state value, and two outputs—the gate voltages. Assuming that the voltages applied to the gates correspond to the values $V_1$ and $V_2$ of Table 2 above, an S2G truth table is as shown below in Table 5.

TABLE 5 state to gates (S2G) truth table

| Input State Value | Input Voltage | $V_{G1}$ | $V_{G2}$ |
|---|---|---|---|
| 0 | 0 | 0 | $V_2$ |
| 1 | $V_{s1}$ | $V_1$ | $V_1$ |
| 2 | $V_{s2}$ | $V_2$ | 0 |

The S2G described above is for three drains of a three-state MSET. However, those having ordinary skill in the art may configure an S2G for MSETs having any number of drains and any number of states, without undue experimentation.

Figure 4:
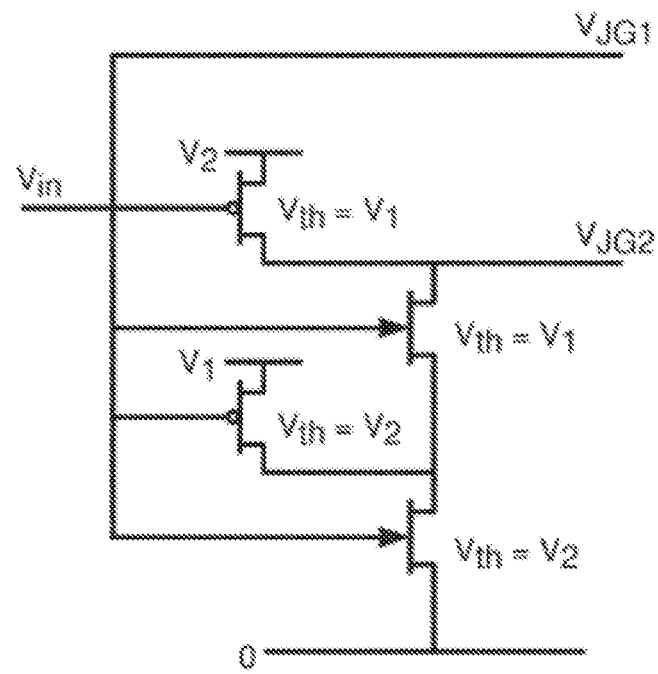
FIG. 4 is a schematic circuit for an S2G (State to Gates) component, according to an embodiment of the present invention.

FIG. 4 is a schematic circuit for an S2G circuit, according to an embodiment of the present invention. The circuit corresponds to the truth table, Table 5, presented above. The circuit comprises two inverting transistors which conduct for different threshold voltages $V_{th}$ ($V_1$ and $V_2$). The circuit also has two non-inverting transistors having different threshold voltages $V_{th}$ ($V_1$ and $V_2$) for conduction.

Figure 5:
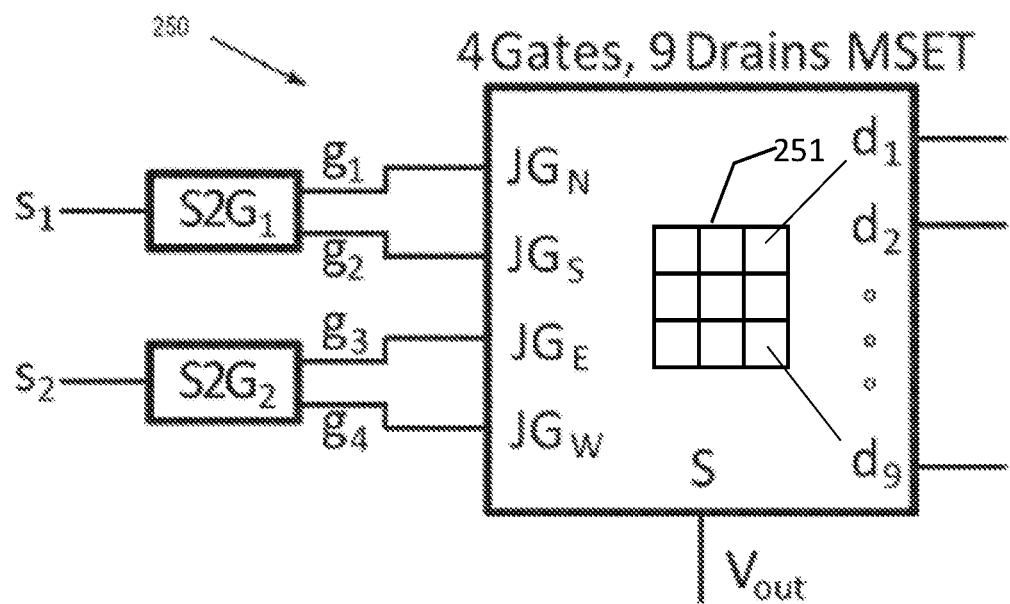
FIG. 5 is a schematic circuit for a ternary multiplexer, according to an embodiment of the present invention.

FIG. 5 is a schematic circuit for a ternary multiplexer 250, according to an embodiment of the present invention. The circuit uses one 4 gate, 9 drain MSET, similar to the 3D MSET illustrated in FIGS. 3A and 3B, but having a 3×3 array 251 of drains. It will be understood that for the 3×3 array of drains the insulating barrier between the drains is not in the form of cross 180, but rather has the form of a viewdata square: #. The circuit uses two S2G circuits, $S2G_1$ and $S2G_2$ to generate the voltages for the MSET gates. By way of example both the circuits are assumed to be similar to the S2G circuit of FIG. 4. $S2G_1$ has an input state $S_1$ (having ternary values 0, 1, or 2) and generates the gate voltages defining the row of the conducting drain. $S2G_2$ has an input state $S_2$ (values 0, 1, or 2) and generates the gate voltages defining the column of the conducting drain. The circuit thus has two ternary control inputs defining which of nine drains is connected to the source, acting as the output of the multiplexer. Considering an S2G circuit as in FIG. 4, the multiplexer of FIG. 5 consists of 8 simple transistors and a single 4 gates, 9 drains MSET. For comparison, a simple 8 inputs binary multiplexer is comprised of around 40 conventional transistors.

Figure 6:
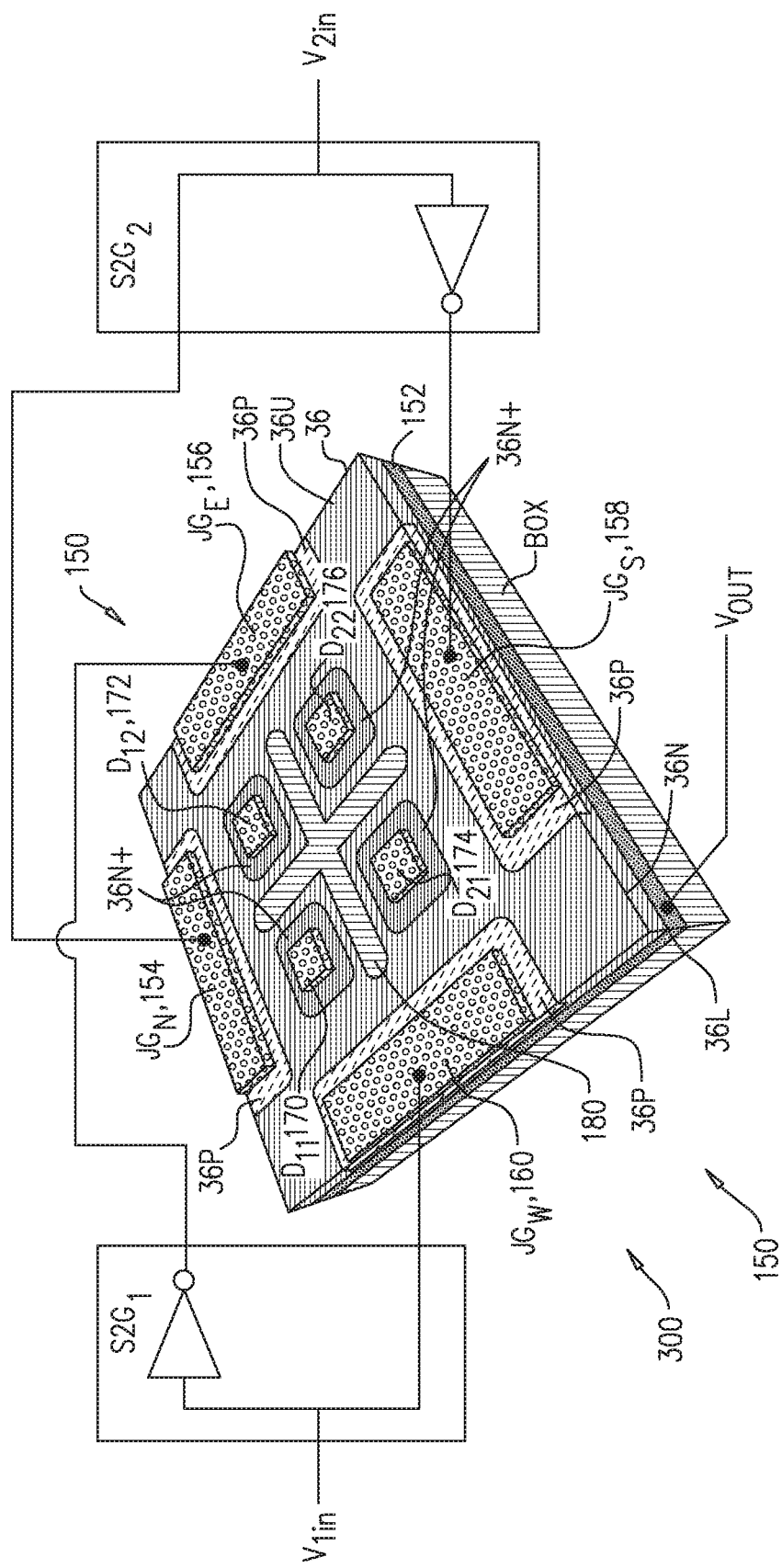
FIG. 6 is a schematic circuit illustrating use of S2G circuits, according to an embodiment of the present invention.

FIG. 6 is a schematic circuit 300 illustrating use of S2G circuits for 3D MSET 150, according to an embodiment of the present invention. A first S2G circuit, $S2G_1$, has outputs connected to $JG_W$ and $JG_E$. A second S2G circuit, $S2G_2$, has outputs connected to $JG_N$ and $JG_S$. Both S2G circuits have a direct connection from respective S2G inputs, $V_{1in}$ and $V_{2in}$, to one of the MSET gates, and a connection via an inverter, a NOT gate, to the opposing MSET gate. Table 6 is a truth table for circuit 300.

TABLE 6

2 S2Gs, 4 gates 4 drain MSET truth table.

| $S2G_1$, $V_{1in}$ | $S2G_2$, $V_{2in}$ | $V_{JGN}$ | $V_{JGS}$ | $V_{JGW}$ | $V_{JGE}$ | $V_O$ |
|---|---|---|---|---|---|---|
| 0 | 0 | 0 | $V_1$ | 0 | $V_1$ | $V_{D11}$ |
| $V_1$ | 0 | 0 | $V_1$ | $V_1$ | 0 | $V_{D12}$ |
| 0 | $V_1$ | $V_1$ | 0 | 0 | $V_1$ | $V_{D21}$ |
| $V_1$ | $V_1$ | $V_1$ | 0 | $V_1$ | 0 | $V_{D22}$ |

3. Device Concatenation

In order to realize complex logical circuits several devices are typically connected in series. Hence, the MSET output voltage (source voltage) is typically of the same sign and magnitude as the input voltage (gates and drain voltage). However, in order to avoid forward biasing between the gates-drains p-n junction the drain voltages are typically non negative while the gate voltages are typically non positive. This contradiction can be removed in several ways: addition of a voltage shifting circuit, addition of a voltage inverting circuit or alternating p-n design. The first two circuits can be realized together with an S2G circuit in order to reduce the number of transistors used in the circuit. This layer is not required when the output of one MSET is connected to the drain of another.

3.1 Voltage Shifting Circuit

In order to allow the source and drain voltages to remain positive, a voltage shifter can be concatenated to the source. This circuit should shift the source voltage $V_s$ by $V_{g,max}<0$ where $V_{g,max}$ is the most negative gate voltage to be used. Hence, if a specific state is defined by the negative voltage $V_i$ the corresponding drain voltage is $V_{d,i}=V_i-V_{g,max}$. For example, assume a 3 drain MSET, as in the adaptation of MSET 100 described above, where $V_1=-1V$ and $V_2=-2V$. States 0, 1 and 2 are represented by voltages 0, −1 and −2 respectively. In this case, $V_{g,max}=-2V$ and the drain voltages corresponding to states 0, 1 and 2 are 2V, 1V and 0V respectively. Those having ordinary skill in the art will understand that this inversion layer can be realized with simple NMOS circuits.

3.2 Voltage Inverting Circuit

A voltage inverter can be concatenated to the source in order to make an appropriate MSET gate voltage. In this case if the gate voltage that brings the EFN to state i is $V_{g,i}$ the corresponding drain voltage is $V_{d,i}=-V_{g,i}$.

3.3 Alternating p-n Design

A mirror p-n MSET comprises an MSET in which the body is lightly doped p type, the drains and source are heavily doped p-type and the gates are heavily doped n-type. In this device the gate voltages are typically positive and the drain voltages negative. Hence, if every MSET level can be concatenated to a mirror MSET level no voltage shifts or inversions are needed.

4. Simulations

The following description is of simulations of an MSET that the inventors have performed. The simulations were performed with Sentaurus TCAD, produced by Synopsys, Inc. Mountain View, Calif.

4.1 Two Gates Two Drains MSET

Figure 7:
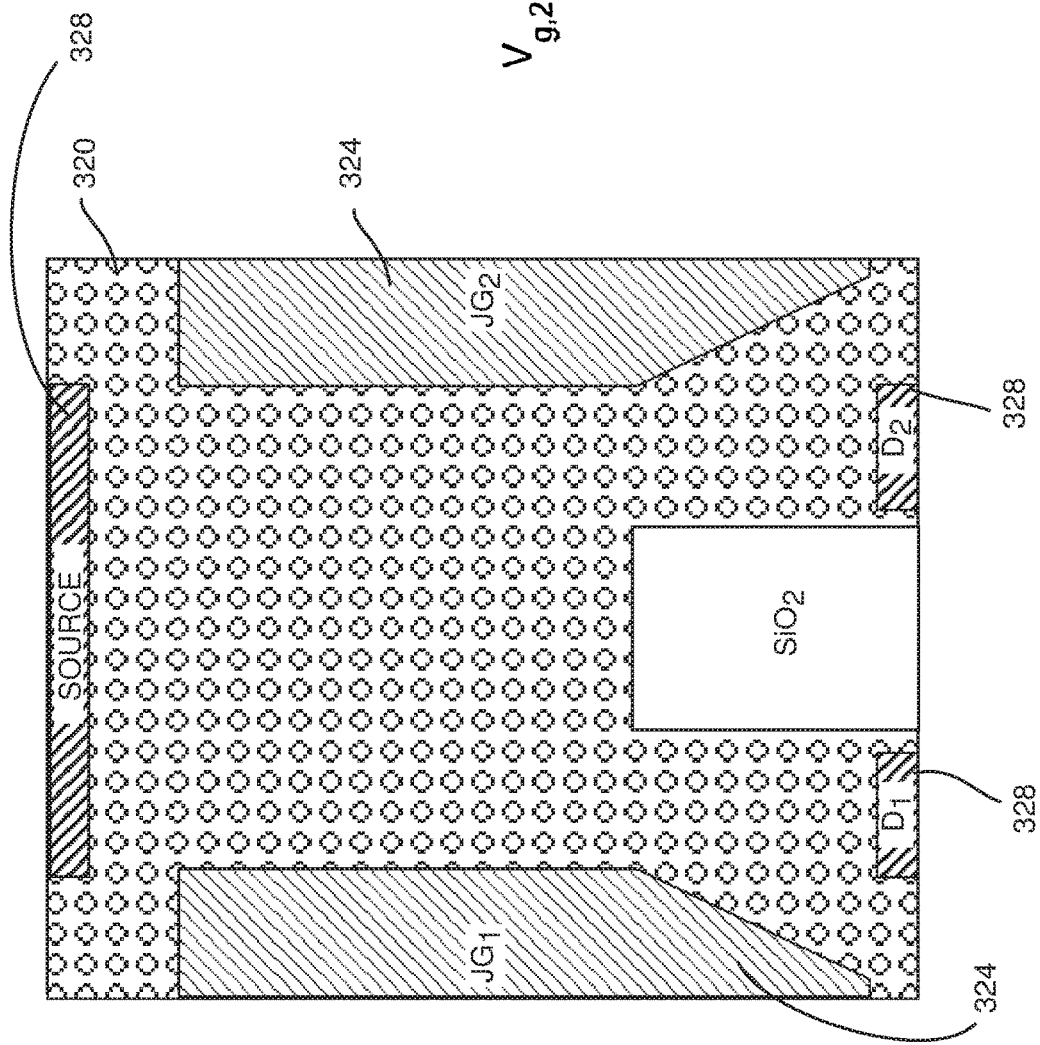
FIG. 7 is a schematic diagram of device geometry used in simulating a two gates two drains MSET, according to an embodiment of the present invention.

FIG. 7 is a schematic diagram of device geometry used in simulating a two gates two drains MSET, according to an embodiment of the present invention. The circuit is as in FIG. 2 where the resistor is 10 MΩ and the drain voltages $V_{D1}$ and $V_{D2}$ are 0.75V and 0.5V respectively. The MSET bulk doping of a simulated substrate 320, corresponding to semiconducting sheet 36, is $10^{17}$ cm$^{-3}$ n type, simulated gates 324 ($JG_1$, $JG_2$), are 5-$10^{19}$ cm$^{-3}$ p type doped, and the simulated source and drains 328 (S, $D_1$, $D_2$) are 5-$10^{19}$ cm$^{-3}$ n type doped.

Figure 8:
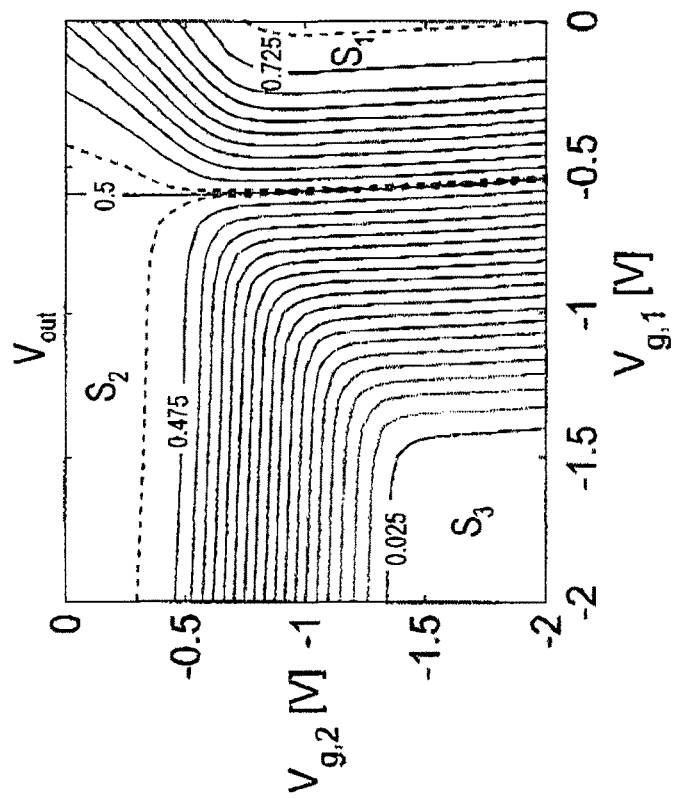
FIG. 8 is a contour graph determined in a simulation, according to an embodiment of the present invention.

FIG. 8 is a contour graph determined in the simulation, according to an embodiment of the present invention. The graph shows the source voltage as a function of the two gate voltages. The voltage difference between any two consecutive iso-voltage lines of the contour graph is 25 mV. The dashed lines show the regions where the output is within 1% of the appropriate drain voltage. When a high voltage is applied to one of the side gates the conduction path is pushed away from it forming a single channel between the opposite drain and the source. As a result, when $V_{JG2}$ is more negative than −0.75V and $V_{JG1}$ is close to 0V, the output voltage is nearly $V_{D1}$. Similarly, when $V_{JG1}$ is below −0.75 and $V_{JG2}$ is close to zero, the output voltage is close to $V_{D2}$. Last, when both gates are lower than −1.5V, there is no conduction through the device and the output is close to 0V. Hence, as can be seen by the areas defined by the dashed curves, three different states can be defined for this device, $S_1$ where $V_{OUT}=V_{D1}$, $S_2$ where $V_{OUT}=V_{D2}$, and $S_3$ where $V_{OUT}=0$.

Figure 9:
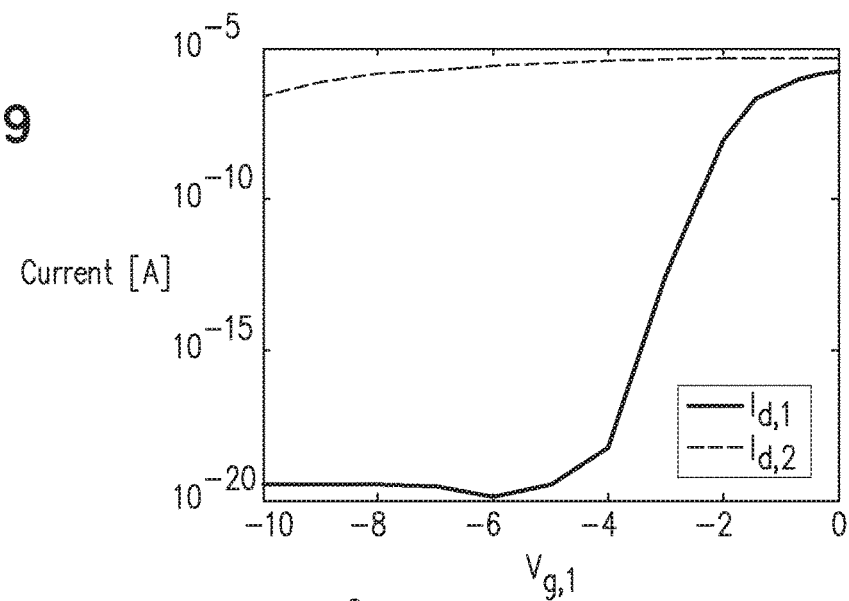
FIG. 9 schematically shows two drain currents as a function of voltage, according to an embodiment of the present invention.

FIG. 9 schematically shows two drain currents as a function of $V_{G1}$ where $V_{G2}$ is grounded, according to an embodiment of the present invention. The graph is determined in a simulation of a device having the same general structure as the geometry of FIG. 7. (The same general structure applies to the simulations of FIG. 10 and FIG. 11, below.) The reverse bias on gate $JG_1$ depletes the region around $D_1$ and the conductive channel shifts towards $D_2$. As a result, the drain 1 current ($I_{d1}$, lower graph) is reduced drastically with $V_{JG1}$. Since the region around drain 2 is less affected by $V_{JG1}$, the reduction in the drain 2 current (upper graph) is quite low.

Figure 10:
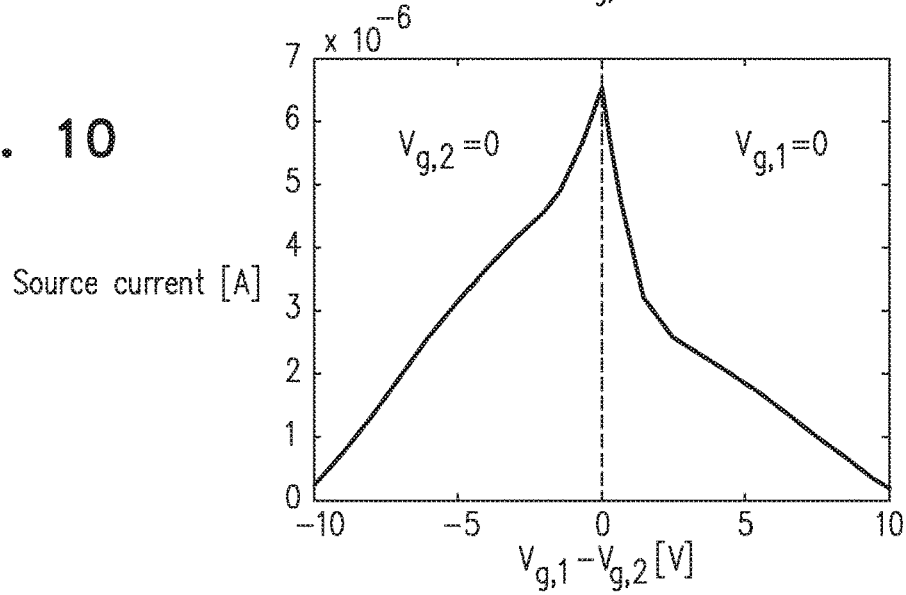
FIG. 10 is a schematic graph of source current vs. difference in gate voltages, according to an embodiment of the present invention.

FIG. 10 is a schematic graph of source current vs. difference in gate voltages, according to an embodiment of the present invention. The graph is determined in the simulation. When one gate is biased, the other is kept grounded. At zero bias on both gates, current can be extracted from both drains and the source current is the largest. When a negative bias is applied to gate JG1, current can be passed only from drain 2 and when a negative bias is applied to gate JG2, current can be passed only from drain 1. However, since drain 2 is at a higher voltage, larger currents pass through it. For example, when $V_{JG1}=-3V$, the source current is 4.14 µA, when $V_{JG2}=-3V$ the source current is 2.43 µA, and when both gates are at zero, the current is 6.4 µA. Hence, 3V gate bias is sufficient to distinguish between the different states. If the source voltage is allowed to float, the device output will be the source voltage.

Figure 11:
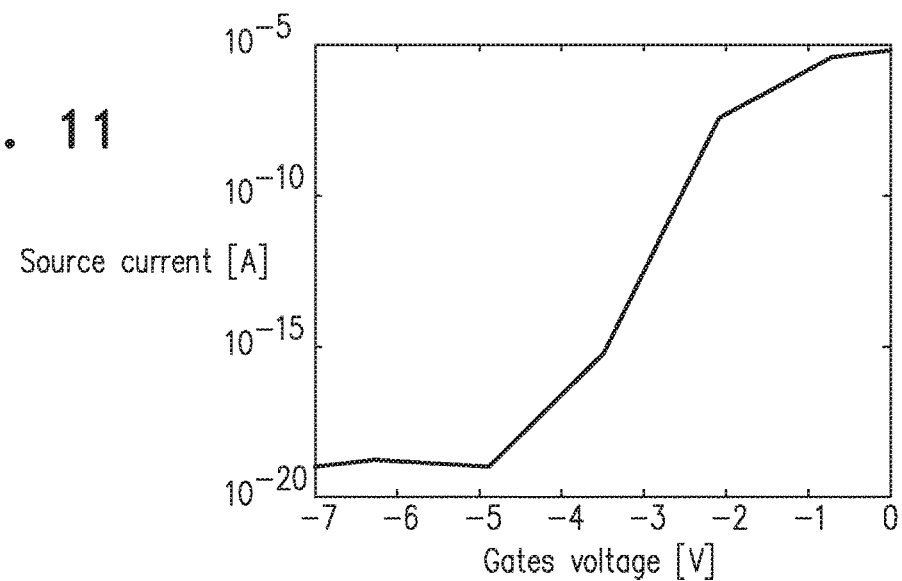
FIG. 11 is a graph of source current vs. gates voltage when a simulated MSET is configured as a NOT gate, according to an embodiment of the present invention.

FIG. 11 is a graph of source current vs. gates voltage when the simulated MSET is configured as a NOT gate, according to an embodiment of the present invention. In this case, both gates are equally biased. As a result, the conduction channel is symmetric and is reduced in size as the bias voltage is increased. Hence, for low voltages high current is extracted from the source but as the voltage increases the current is reduced dramatically.

4.2 2 Gates, 3 Drains MSET

Figure 12:
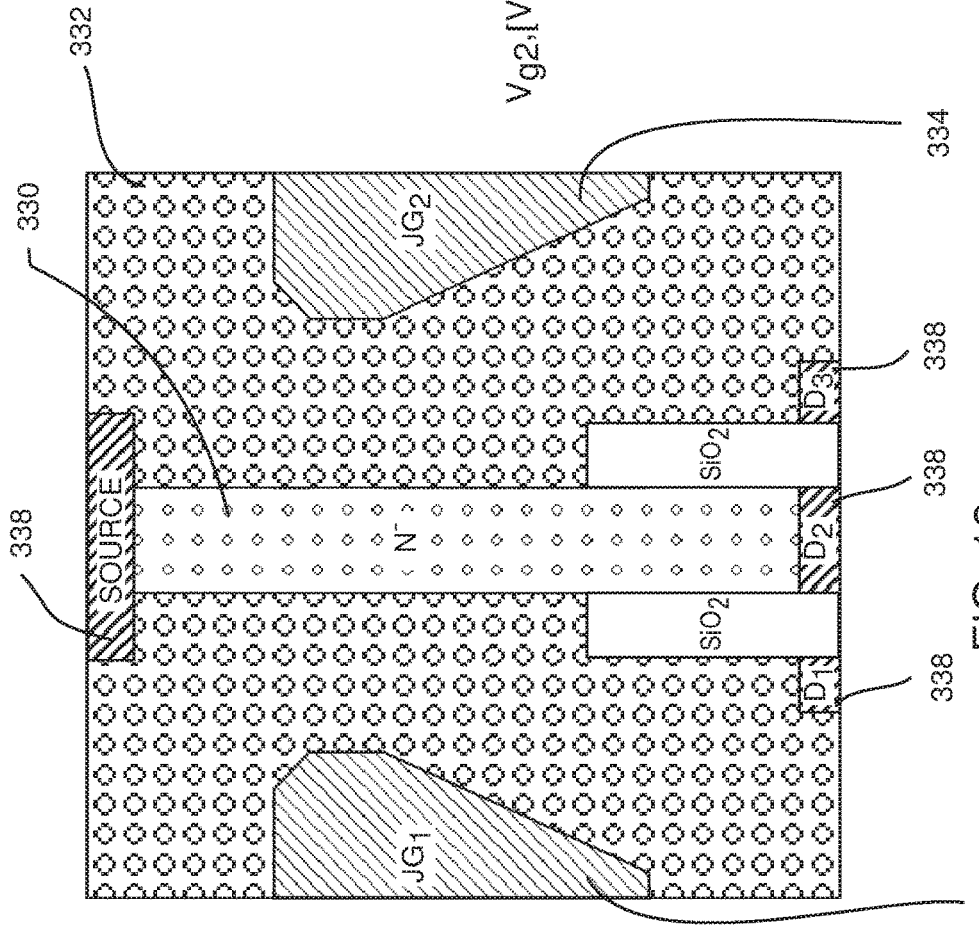
FIG. 12 is a schematic diagram of device geometry used in simulating a two gates three drains MSET, according to an embodiment of the present invention.

FIG. 12 is a schematic diagram of device geometry used in simulating a two gates three drains MSET, according to an embodiment of the present invention. The circuit is similar to that of FIG. 2, except that the MSET has three drains rather than two drains. The resistor is 1 GΩ and the drain voltages $V_{D1}$, $V_{D2}$ and $V_{D3}$ are 0.75V, 0.5V and 0.25V respectively. The device doping concentrations are as in the two gates two drains MSET described above, apart from a central $N^-$ region 330 which is n type doped with a concentration of $10^{16}$ cm$^{-3}$. Thus, the MSET bulk doping of a simulated substrate 332, corresponding to semiconducting sheet 36, is $10^{17}$ cm$^{-3}$ n type, simulated gate regions 334, corresponding to the gates $JG_1$, $JG_2$, are 5-$10^{19}$ cm$^{-3}$ p type doped, and the simulated source and drain regions 338, corresponding to source S and drains $D_1$, $D_2$, are 5-$10^{19}$ cm$^{-3}$ n type doped.

Figure 13:
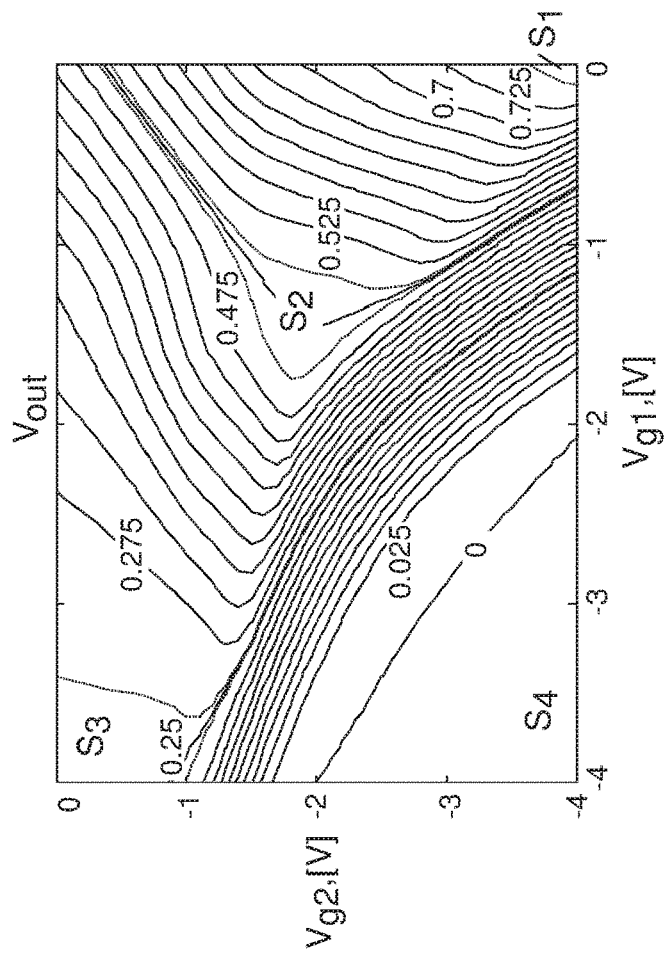
FIG. 13 is a contour graph determined in a simulation, according to an embodiment of the present invention.

FIG. 13 is a contour graph determined in the simulation, according to an embodiment of the present invention. The graph shows the source voltage as a function of the two side gates voltages. The voltage difference between any two iso-voltage lines of the graph is 25 mV. The dashed lines show the regions where the output is within 1% of the appropriate drain voltage. As in the previous simulation, the different states are easily distinguished. As can be seen by the areas defined by the dashed lines, four different states can be defined for this device: $S_1$ where $V_{OUT}=V_{D1}$, $S_2$ where $V_{OUT}=V_{D2}$, $S_3$ where $V_{OUT}=V_{D3}$, and $S_4$ where $V_{OUT}=0$.

4.3 4 Gates 4 Drains MSET

Figure 14:
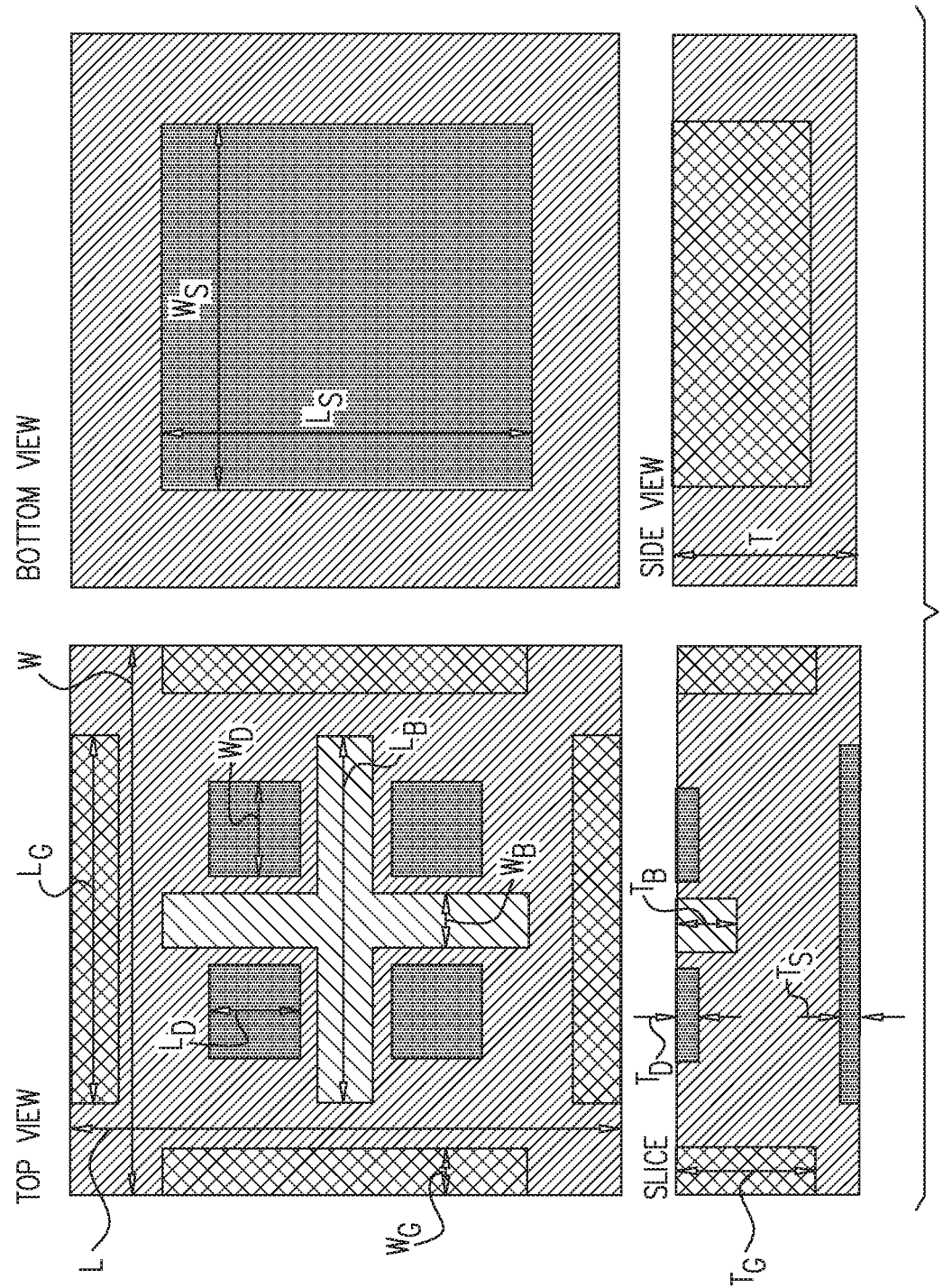
FIG. 14 illustrates simulated geometry of a 4 gates, 4 drain MSET, according to an embodiment of the present invention.
Figure 15:
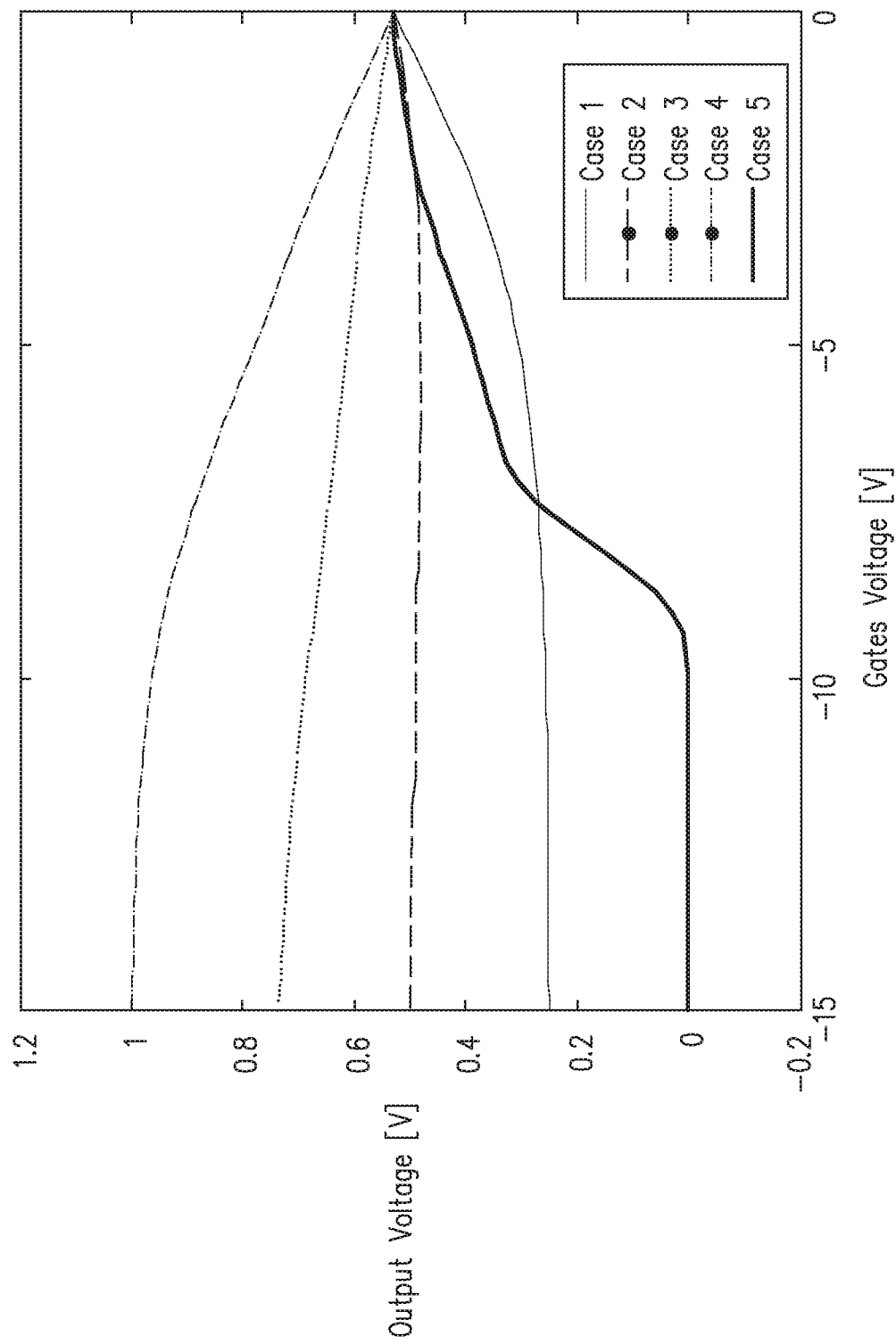
FIG. 15 is a graph of output voltage vs. gates voltage for an MSET, according to an embodiment of the present invention.

FIG. 14 illustrates simulated geometry of a 4 gates, 4 drain MSET, and FIG. 15 is a graph of output voltage vs. gates voltage for the MSET, according to an embodiment of the present invention. A 4 gates 4 drains MSET, corresponding to the MSET illustrated in FIGS. 3A and 3B, was simulated and the simulation electrical connections are as in the previous sections—each gate was connected to a variable voltage and each drain was connected to a different voltage level in order to allow easy state determination. The drain voltages $V_{D11}$, $V_{D12}$, $V_{D21}$, $V_{D22}$ are 0.25V, 0.5V, 0.75V and 1V respectively. The simulated geometry and parameters are shown in FIG. 14 and in Table 7 below. In the simulations there are 5 cases. In cases 1 to 4 two adjacent gates are equally biased and the remaining two are grounded. In the last case all four gates are equally biased. Table 8 below lists the different cases, and the voltages applied to the gates for each of the cases, and FIG. 15 shows the output voltage for each case as a function of the two gates voltages. As in the 2 gates device, the device output voltage is undefined when all gates are at 0V. However, when applying negative bias to two adjacent gates the conduction channel is confined to a specific row and column conducting between one of the drains and the source and isolating the other drains. As a result, the output voltage reaches the appropriate drain voltage and a clear state is defined. When all four gates are biased the device is completely depleted, there is no conduction between any of the drains and the source and the output is 0V.

TABLE 7

4 gates, 4 drains MSET simulation parameters

| Parameter | Symbol | Value |
| --- | --- | --- |
| Device length and width | L, W | 600 (nm) |
| Device thickness | T | 200 (nm) |
| Drains length and width | $L_D$, $W_D$ | 100 (nm) |
| Drains thickness | $T_D$ | 100 (nm) |
| Source length and width | $L_S$, $W_S$ | 400 (nm) |
| Source thickness | $T_S$ | 20 (nm) |
| Gates length | $L_G$ | 400 (nm) |
| Gates width | $W_G$ | 50 (nm) |
| Gates thickness | $T_G$ | 150 (nm) |
| Oxide buffer length | $L_B$ | 400 (nm) |
| Oxide buffer width | $W_B$ | 60 (nm) |
| Oxide buffer thickness | $T_B$ | 60 (nm) |
| Resistor | R | 1 GΩ |
| Drain 1 voltage | $V_{D1}$ | 0.25 V |
| Drain 2 voltage | $V_{D2}$ | 0.5 V |
| Drain 3 voltage | $V_{D3}$ | 0.75 V |
| Drain 4 voltage | $V_{D4}$ | 1 V |
| Bulk Doping | $N_{d, 0}$ | $10^{17}$ cm$^{-3}$(Phosphorous) |
| Drains Doping | $N_{d, D}$ | $5 \times 10^{19}$ cm$^{-3}$(Phosphorous) |
| Source Doping | $N_{d, S}$ | $5 \times 10^{19}$ cm$^{-3}$(Phosphorous) |
| Gates Doping | $N_{a, G}$ | $5 \times 10^{19}$ cm$^{-3}$(Phosphorous) |

TABLE 8

4 gates 4 drains simulation cases

| | Final Gates biases | | | |
| --- | --- | --- | --- | --- |
| Case | $JG_N$ | $JG_S$ | $JG_E$ | $JG_W$ |
| 1 | 0 | −15 | 0 | −15 |
| 2 | 0 | −15 | −15 | 0 |
| 3 | −15 | 0 | 0 | −15 |
| 4 | −15 | 0 | −15 | 0 |
| 5 | −15 | −15 | −15 | −15 |

5. Alternative Embodiments

5.1 Multiple Sources

The description above, in sections 1-4, has assumed that an MSET has a single source and multiple isolated drains. Such an embodiment is referred to herein as a single source MSET. The scope of the present invention includes a converse configuration, comprising a single drain and separate, isolated, multiple sources, referred to herein as a single drain MSET. The construction of a single drain MSET is generally similar to the construction of a single source MSET (FIGS. 2 and 3A and 3B), so that both types of MSETs are constructed on a semiconducting substrate, with at least one gate on a surface of the substrate. However, in contrast to the single source MSET, in the single drain MSET there is one drain and a multiplicity of isolated sources. As for a single source MSET, in a single drain MSET an EFN may be formed by applying appropriate voltages to its gates, and the EFN may be configured to form a single conducting path between the single drain and one of the sources. The voltages on the gates vary the actual path taken by the EFN, so that appropriate selection of the gate voltages selects a given source as being an end-point of the conducting path; the other end-point is the single drain.

As for single source MSETs, single drain MSETs may be configured as either 2D single drain MSETs or as 3D single drain MSETs.

5.2 Multiple Sources, Multiple Drains

An alternative embodiment of the present invention comprises an MSET having multiple sources and multiple drains, herein termed a multiple sources-multiple drains transistor (MSMDT). The construction of an MSMDT is generally similar to the construction of a single source MSET (FIGS. 2 and 3A and 3B), so that both types of MSETs are constructed on a semiconducting substrate, with at least one gate on a surface of the substrate. However, in an MSMDT there are a multiplicity of isolated sources, and a multiplicity of isolated drains. While there may be the same number of sources and drains, this is not a requirement. Thus, some examples of MSMDTs are with:

2 drains, 2 sources; 3 drains, 2 sources;
2 drains, 3 sources; or
3 drains, 3 sources.

In an MSMDT an EFN may be formed by applying appropriate voltages to its gates, and the EFN may be configured to form a single conducting path between a selected one of the drains and a selected one of the sources. The voltages on the gates vary the actual path taken by the EFN, so that appropriate choice of the gate voltages selects a given source and a given drain as being end-points of the chosen conducting path.

In an MSMDT the geometry of the, sources, the drains, and of the gates may be varied so that each possible path between the sources and the drains may be uniquely selected by a respective unique setting of the gate voltages. For example, in a 2D MSMDT that is similar to FIG. 2, except that it has 2 isolated sources, the separation of the sources may be configured to be different from the separation of the drains. Other possible alterations in the geometry of the MSMDT, to accommodate the requirement of a unique gate voltage producing a unique source-drain path, will be apparent to those having ordinary skill in the art, and all such geometries are included in the scope of the present invention.

It will be understood that MSMDTs may be configured as either 2D MSMDTs or as 3D MSMDTs.

5.3 Multiple Sources, Multiple Drains, Split Gates

In a further alternative embodiment of the present invention, an MSMDT has a first set of gates configured to select the source at the end-point of the EFN, and a second set of gates configured to select the drain at the other end-point of the EFN. For example, considering a 2 drain 2 source 2D MSMDT in the general form of FIG. 2, each of the gates may be split into two isolated gates, so that there is a first pair of isolated gates near the sources, and a second pair of isolated gates near the drains. For any chosen EFN the first pair of gates may be used to select the source of the EFN, and the second pair of gates may be used to select the EFN's drain.

For a 3D MSMDT, in the general form of FIGS. 3A and 3B, the gates may be split so that a first set of gates is on the surface of the semiconducting substrate having the multiple sources, and a second set of gates is on the surface having the multiple drains. For any chosen EFN the first set of gates select the source, and the second set of gates select the drain.

6. Active Separators

The embodiments described above assume that drains are separated by insulating separators, typically formed of $SiO_2$. For example, separator 106 of MSET 100 is an insulating separator. In alternative embodiments of the present invention, the drains of an MSET are separated by active separators, i.e., separators that are non-insulating so that they are formed as a semiconductor similar to other semiconducting elements of the MSET.

Figure 16:
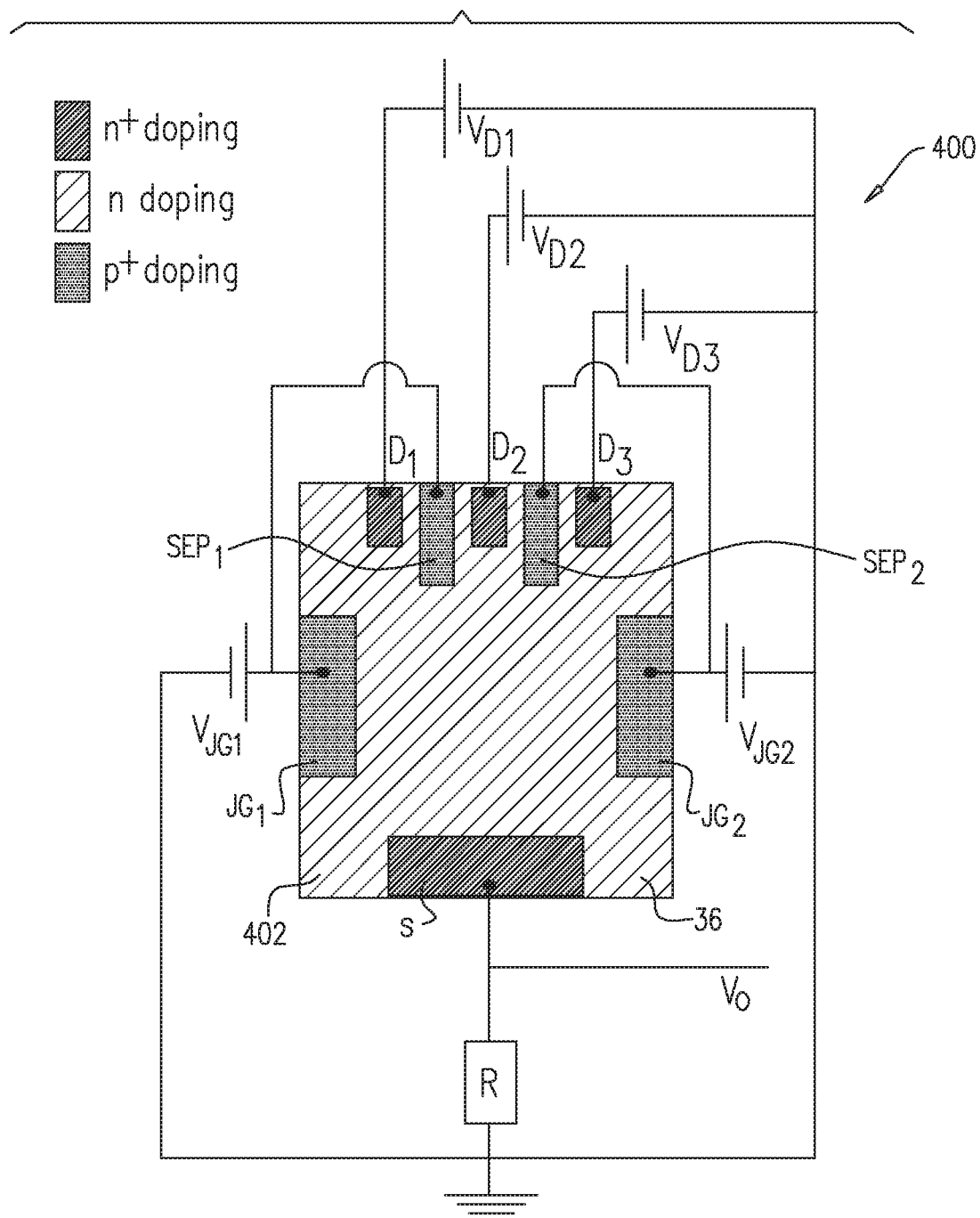
FIG. 16 is a schematic diagram of a circuit for an active separator MSET, according to an embodiment of the present invention.
Figure 17:
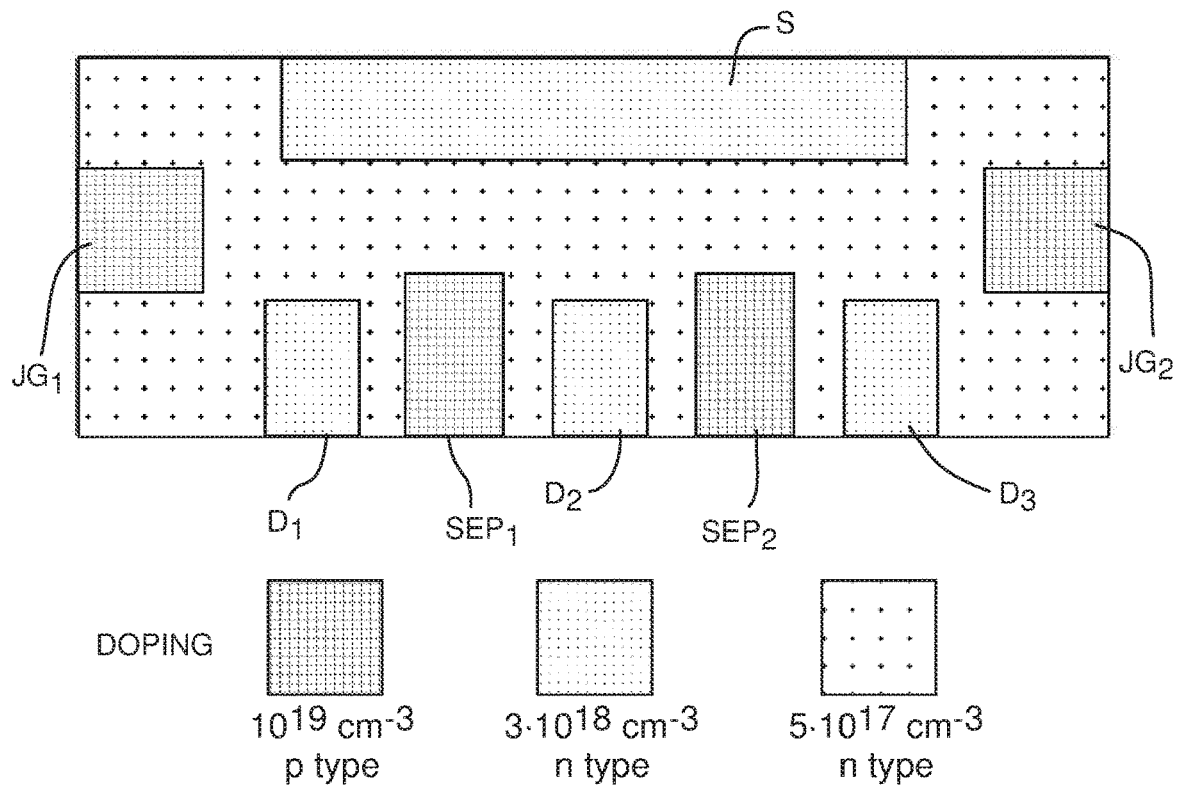
FIG. 17 is a schematic diagram of the geometry of an MSET used in a simulation of a circuit, according to an embodiment of the present invention.

FIG. 16 is a schematic diagram of a circuit 400 for an active separator MSET 402, and FIG. 17 is a schematic diagram of the geometry of MSET 402 used in a simulation of the circuit, according to an embodiment of the present invention. Apart from the differences described below, the operation of MSET 402 is generally similar to that of MSET 100 with three drains (FIG. 2), and elements indicated by the same reference identifiers in both MSETs are generally similar in construction and in operation.

In contrast to the drains of the three drain MSET 100 described above, which are separated by insulating elements, the three drains $D_1$, $D_2$, $D_3$ of MSET 402 are separated by non-insulating active separators $SEP_1$ and $SEP_2$. In the simulation of circuit 400, $SEP_1$ and $SEP_2$ have $10^{19}$ cm$^{-3}$ p-type doping. As is shown in FIG. 16, in the simulation of the circuit separator $SEP_1$ is galvanically connected to gate $JG_1$, and separator $SEP_2$ is galvanically connected to gate $JG_2$.

Figure 18:
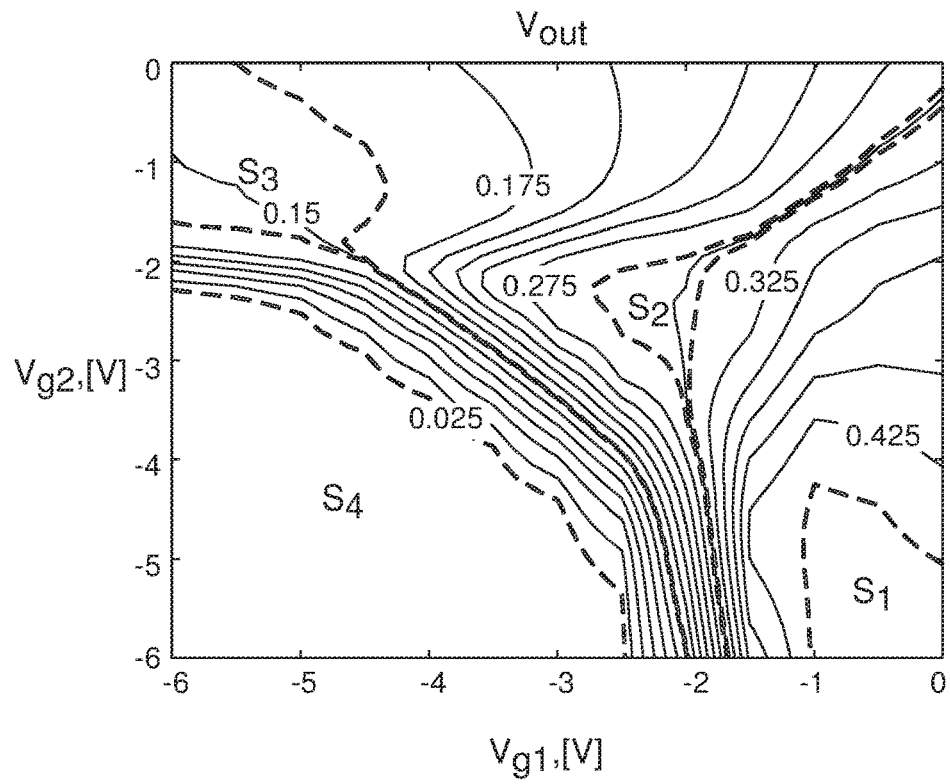
FIG. 18 is a contour graph of output voltage vs. gates voltage for an MSET, according to an embodiment of the present invention.

FIG. 18 is a contour graph of output voltage vs. gates voltage for MSET 402, according to an embodiment of the present invention. The graph is produced by simulation of circuit 400, and in the simulation the potentials of drains $D_1$, $D_2$, $D_3$ are set respectively to $V_{D1}=0.45$ V, $V_{D2}=0.3$ V, and $V_{D3}=0.15$ V. The graph shows the output voltage as a function of the two gate voltages, $JG_1$ and $JG_2$. The voltage difference between any two iso-voltage lines of the graph is 25 mV. The dashed lines show the regions where the output is within 1% of the appropriate drain voltage. As is illustrated by the areas defined by the dashed lines, four different states for MSET 402 can be distinguished: $S_4$ where $V_{OUT}=0$, $S_3$ where $V_{OUT}=V_{D3}$, $S_2$ where $V_{OUT}=V_{D2}$, and $S_1$ where $V_{OUT}=V_{D1}$.

Using active separators, such as those described for MSET 402, enables the separators to actively participate in the operation of the device, since the regions where the nanowire are formed are close to the separators. The result is that the operating voltages needed to define a given nanowire are significantly reduced compared to MSETs having non-active, i.e., insulating, dielectric separators. In addition active separators, comprising doped regions on semiconducting sheet 36, may be easier to manufacture than dielectric separators, since the latter may first require etching of the sheet and then filling the sheet with the required dielectric material.

While the description of MSET 402 applies to a 2D MSET, it will be understood that embodiments of the present invention include 3D MSETs with active separators. For example, in MSET 150 (FIG. 3A) insulating barrier 180 could be configured as four separate line barriers, each of which may be non-insulating, so acting as non-insulating separators between the drains. As for the 2D MSETs, voltages on the non-insulating separators of the 3D MSETs may be arranged to facilitate formation of a required nanowire.

In addition to the embodiments described above, of MSETs with insulating separators between the drains and of MSETs with non-insulating separators between the drains, embodiments of the present invention comprise MSETs having both insulating and non-insulating separators. For example, in a 2D MSET similar to MSET 100 of FIG. 2, but having four drains and three separators, the two outer separators may be configured to be non-insulating, while the central separator may be insulating. Other embodiments of MSETs using both insulating and non-insulating separators will be apparent to those having ordinary skill in the art, and all such embodiments are assumed to be within the scope of the present invention.

While the description above has assumed, by way of example, that MSET semiconducting materials have a specific type of doping, with corresponding voltage values, it will be appreciated that embodiments of the present invention include MSETs with semiconducting materials having "reverse" doping, with corresponding reversal of voltage values.

The description of the embodiments described above provides examples where a single conductive path is formed between a single source and a single drain. It will be understood that embodiments of the present invention include MSETs where a single conductive path is formed between one or more sources and one or more drains. For example, in an embodiment having three sources and four drains, a single conductive path may be formed between two adjacent sources and two adjacent drains. All such embodiments are included in the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A transistor, comprising:
a planar semiconducting substrate, wherein the planar semiconducting substrate has a first face and a second face opposite the first face;
a source formed on the first face of the substrate;
a first drain formed on the second face of the substrate;
a second drain formed on the second face of the substrate in a location physically separated from the first drain;
four spatially separated gates formed on the second face of the substrate and configured to selectably apply an electrical potential to the substrate in either a first spatial pattern, which causes a first conductive path to be established electrostatically within the substrate from the source to the first drain, or a second spatial pattern, which causes a second conductive path to be established electrostatically within the substrate from the source to the second drain,
wherein the first drain and the second drain are comprised in a rectangular m×n array of physically separated drains formed on the second face, where at least one of m and n is a positive integer greater than 1, and
wherein the four gates are disposed about the rectangular array; and
two state to gates components each configured to receive a ternary input state and in response to supply respective voltage outputs to opposing two of the four gates,
wherein the rectangular m×n array comprises a 3×3 array, and wherein the transistor is configured as a two ternary input state, nine output state multiplexer.

2. A method, comprising:
utilizing a planar semiconducting substrate, wherein the planar semiconducting substrate has a first face and a second face opposite the first face;
forming a source on the first face of the substrate;
forming a first drain on the second face of the substrate;
forming a second drain on the second face of the substrate in a location physically separated from the first drain;
forming four spatially separated gates on the second face of the substrate, and configuring the four gates to selectably apply an electrical potential to the substrate in either a first spatial pattern, which causes a first conductive path to be established electrostatically within the substrate from the source to the first drain, or a second spatial pattern, which causes a second conductive path to be established electrostatically within the substrate from the source to the second drain,
wherein the first drain and the second drain are comprised in a rectangular m×n array of physically separated drains formed on the second face, where at least one of m and n is a positive integer greater than 1, and
wherein the four gates are disposed about the rectangular array; and
providing two state to gates components each configured to receive a ternary input state and in response to supply respective voltage outputs to opposing two of the four gates,
wherein the rectangular m×n array comprises a 3×3 array, configured to act as two ternary input state, nine output state multiplexer.

* * * * *